United States Patent
Dalton et al.

(10) Patent No.: US 8,754,400 B2
(45) Date of Patent: Jun. 17, 2014

(54) TWO-DIMENSIONAL PATTERNING EMPLOYING SELF-ASSEMBLED MATERIAL

(75) Inventors: Timothy J. Dalton, Ridgefield, CT (US); Bruce B. Doris, Brewster, NY (US); Ho-Cheol Kim, San Jose, CA (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/432,036

(22) Filed: Mar. 28, 2012

(65) Prior Publication Data

US 2012/0183743 A1    Jul. 19, 2012

Related U.S. Application Data

(62) Division of application No. 12/017,598, filed on Jan. 22, 2008, now Pat. No. 8,207,028.

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |

(52) U.S. Cl.
USPC ............... 257/20; 257/E21.24; 257/E29.255

(58) Field of Classification Search
USPC ............... 257/20, E21.24, E29.255
See application file for complete search history.

(56) References Cited

U.S. PATENT DOCUMENTS

| | | | |
|---|---|---|---|
| 4,437,226 A | 3/1984 | Soclof | |
| 5,133,120 A | 7/1992 | Kawakami et al. | |
| 5,587,589 A | 12/1996 | So et al. | |
| 5,916,821 A | 6/1999 | Kerber | |
| 6,204,145 B1 | 3/2001 | Noble | |
| 6,319,333 B1 * | 11/2001 | Noble | 148/33.2 |
| 6,777,260 B1 | 8/2004 | Chen | |

(Continued)

FOREIGN PATENT DOCUMENTS

WO    2008130847    10/2008

OTHER PUBLICATIONS

Nealey et al., "Self-Assembling Resists for Nanolithography," IEDM Technical Digest (Dec. 2005) Digital Object Identifier 10.1109/IEDM.2005.1609349.

(Continued)

*Primary Examiner* — David S Blum
(74) *Attorney, Agent, or Firm* — Scully, Scott, Murphy & Presser, P.C.; Katherine S. Brown

(57) ABSTRACT

A first nanoscale self-aligned self-assembled nested line structure having a sublithographic width and a sublithographic spacing and running along a first direction is formed from first self-assembling block copolymers within a first layer. The first layer is filled with a filler material and a second layer is deposited above the first layer containing the first nanoscale nested line structure. A second nanoscale self-aligned self-assembled nested line structure having a sublithographic width and a sublithographic spacing and running in a second direction is formed from second self-assembling block copolymers within the second layer. The composite pattern of the first nanoscale nested line structure and the second nanoscale nested line structure is transferred into an underlayer beneath the first layer to form an array of structures containing periodicity in two directions.

20 Claims, 34 Drawing Sheets

(56) References Cited

U.S. PATENT DOCUMENTS

| | | |
|---|---|---|
| 6,790,745 B1 | 9/2004 | Blanchard |
| 7,497,958 B2 | 3/2009 | Sandhu |
| 7,605,081 B2 | 10/2009 | Yang et al. |
| 8,330,246 B2 * | 12/2012 | Thomas .................. 257/510 |
| 2007/0175859 A1 | 8/2007 | Black et al. |
| 2007/0224819 A1 | 9/2007 | Sandhu |
| 2007/0249174 A1 | 10/2007 | Yang |
| 2007/0281220 A1 | 12/2007 | Sandhu et al. |

OTHER PUBLICATIONS

European Search Report, Feb. 19, 2013; Application No. 09704665.0—1555/2235743 PCT US2009031044.

Application No. 98100104, TIPO Office Action dated Apr. 30, 2013.

* cited by examiner

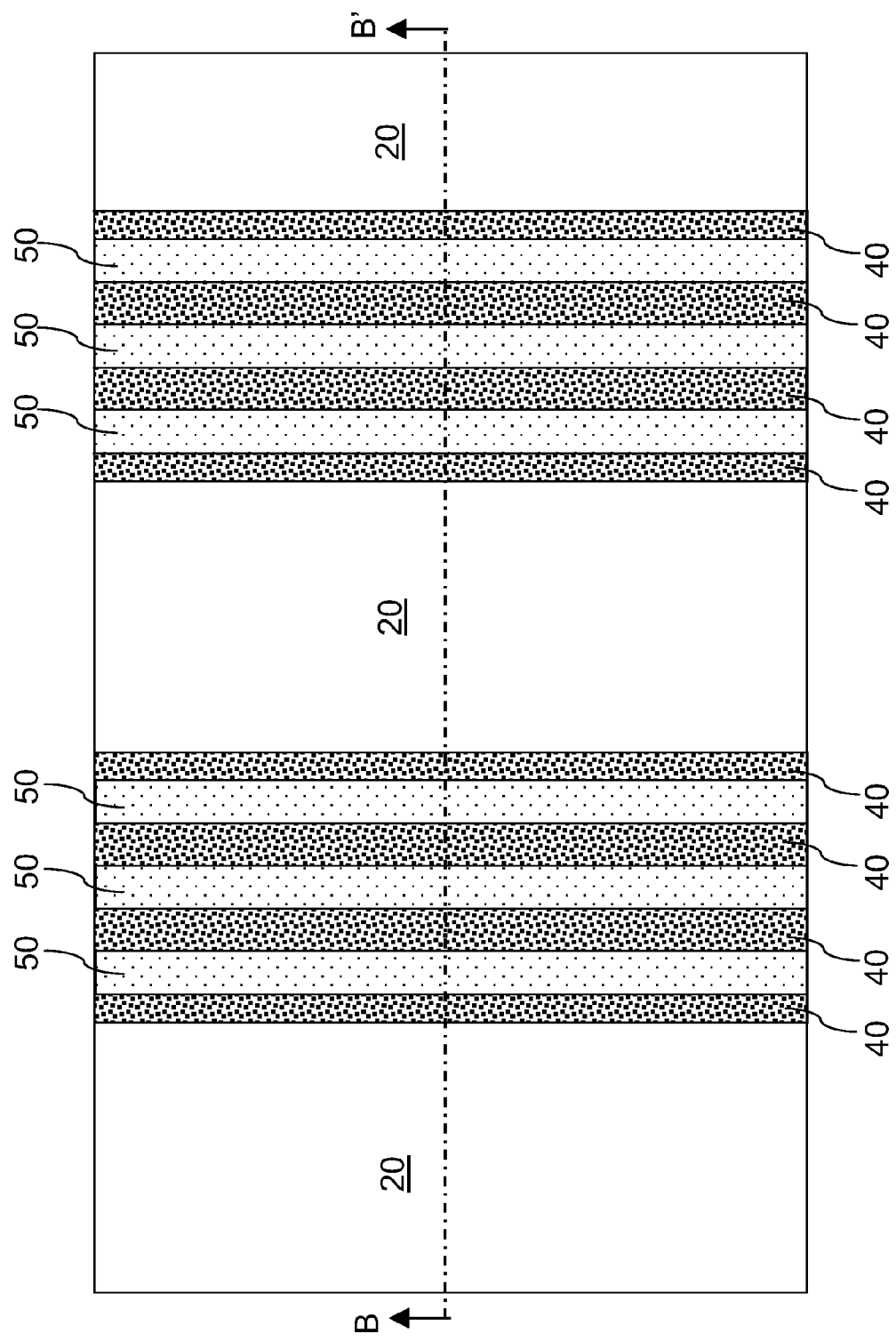

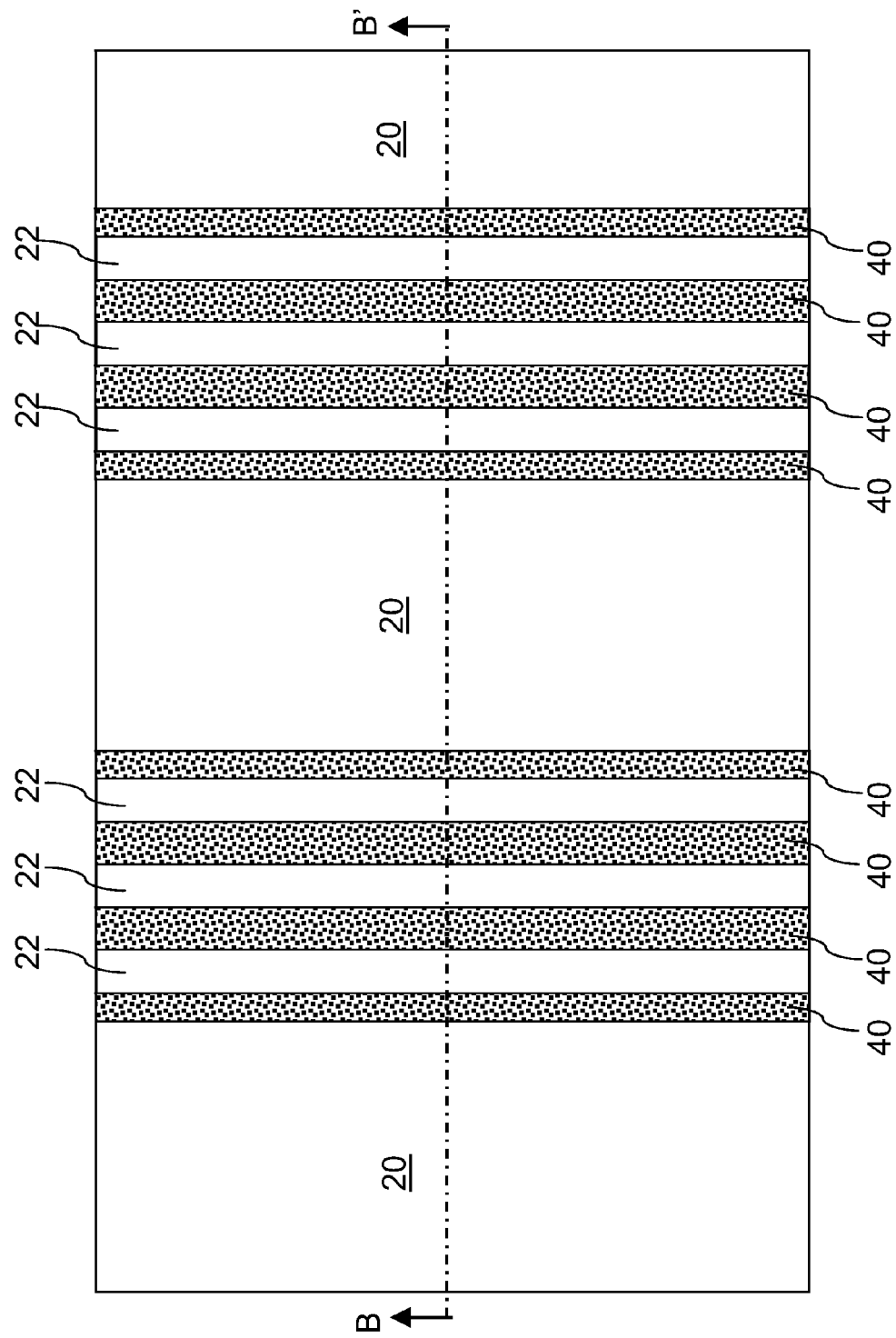

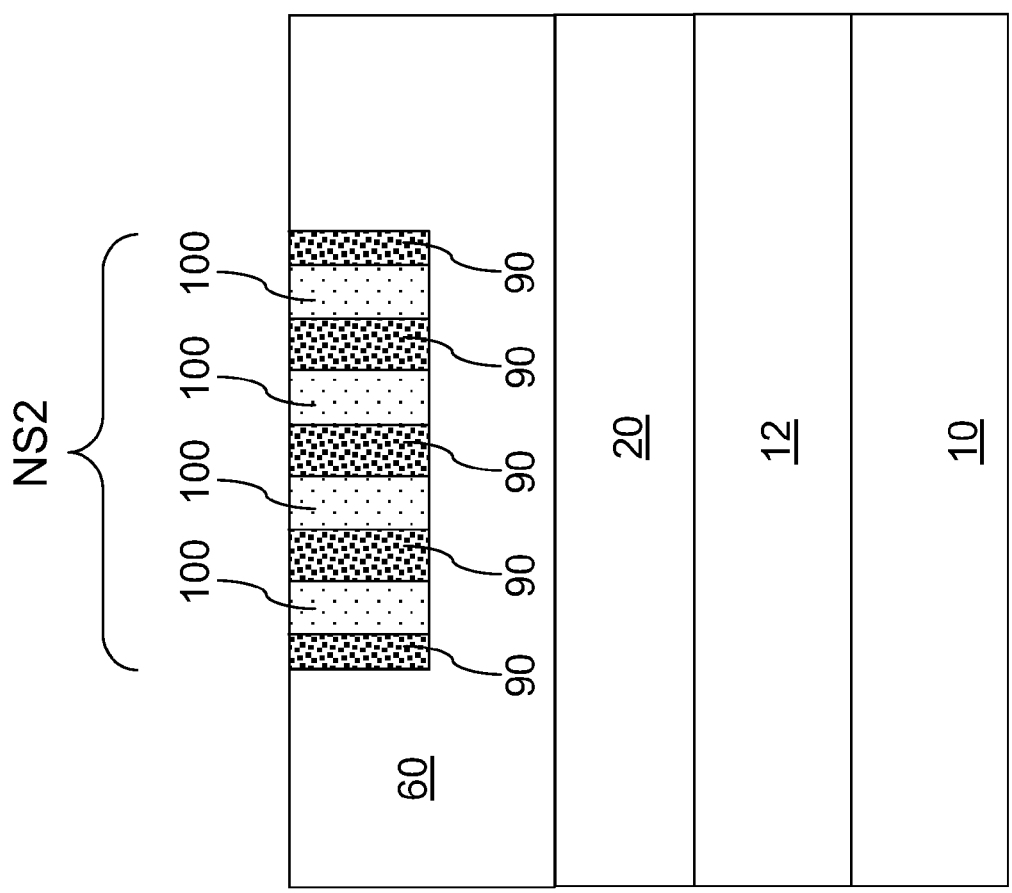

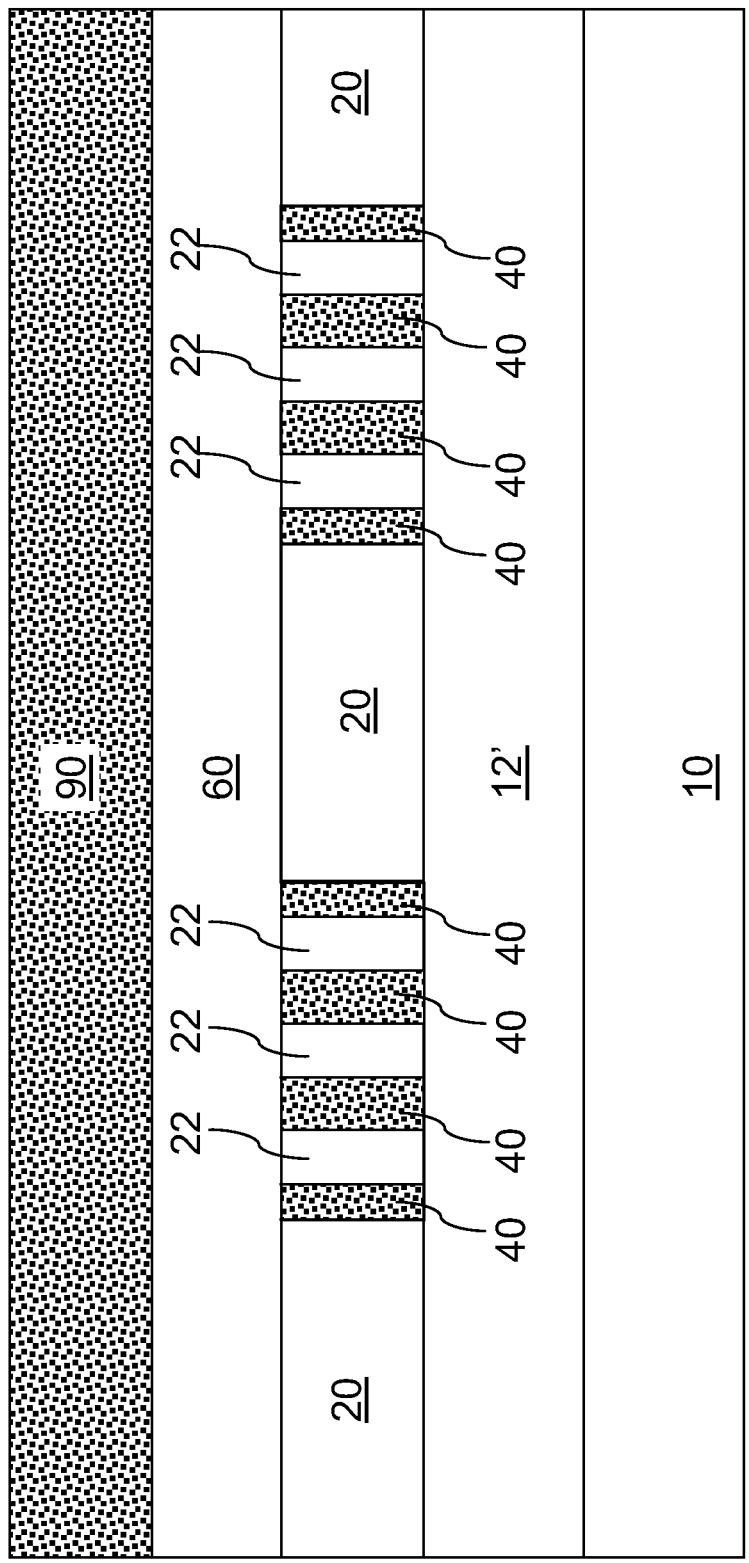

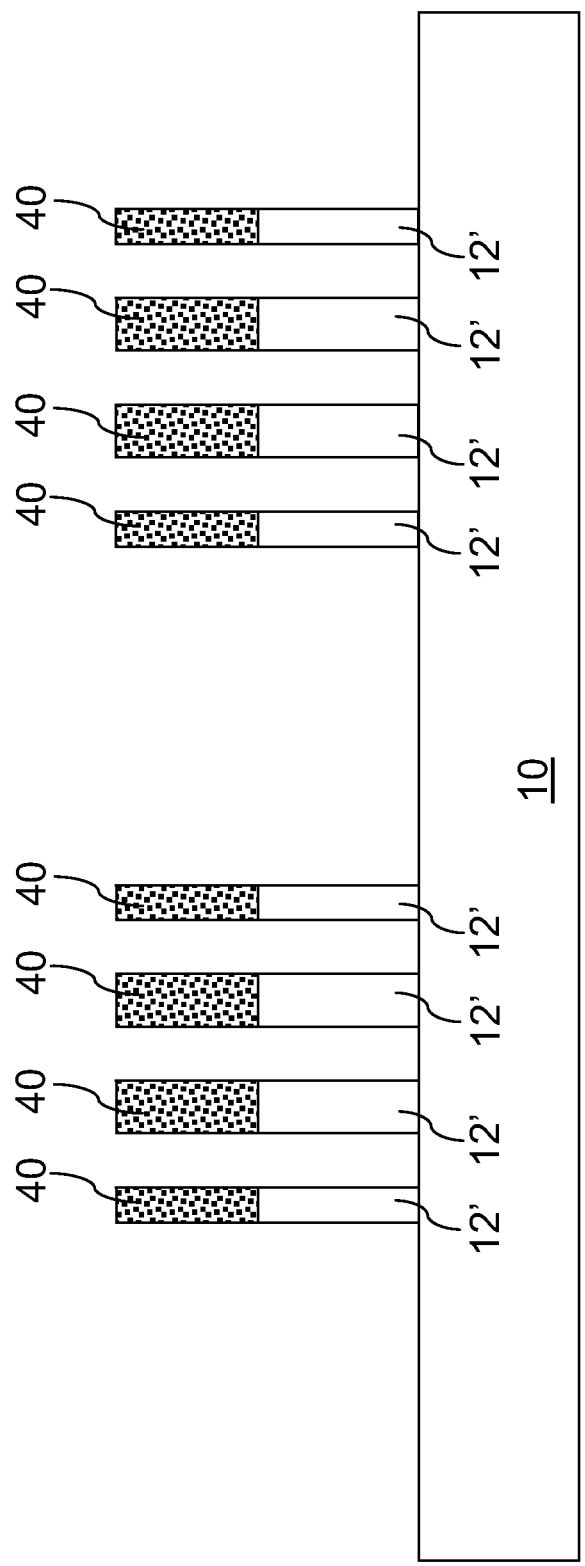

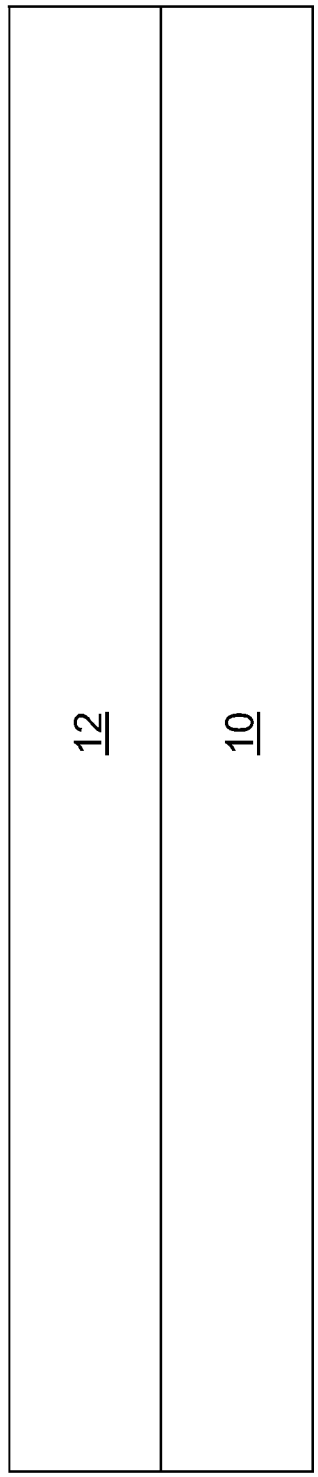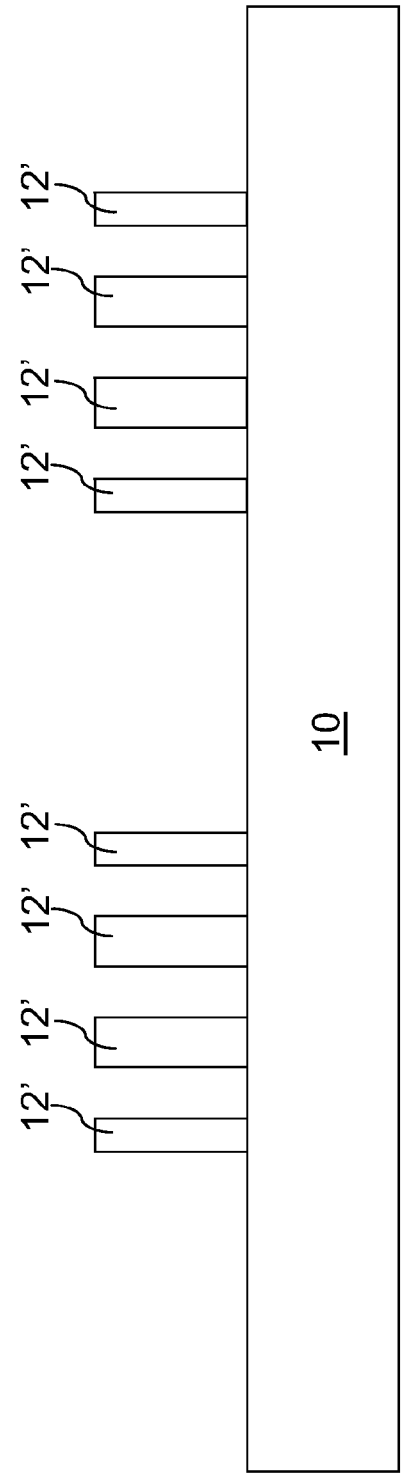

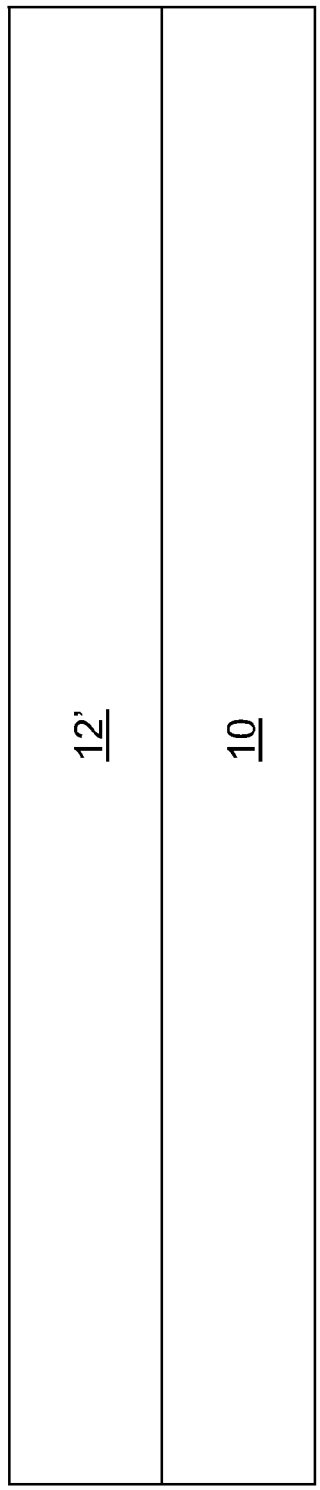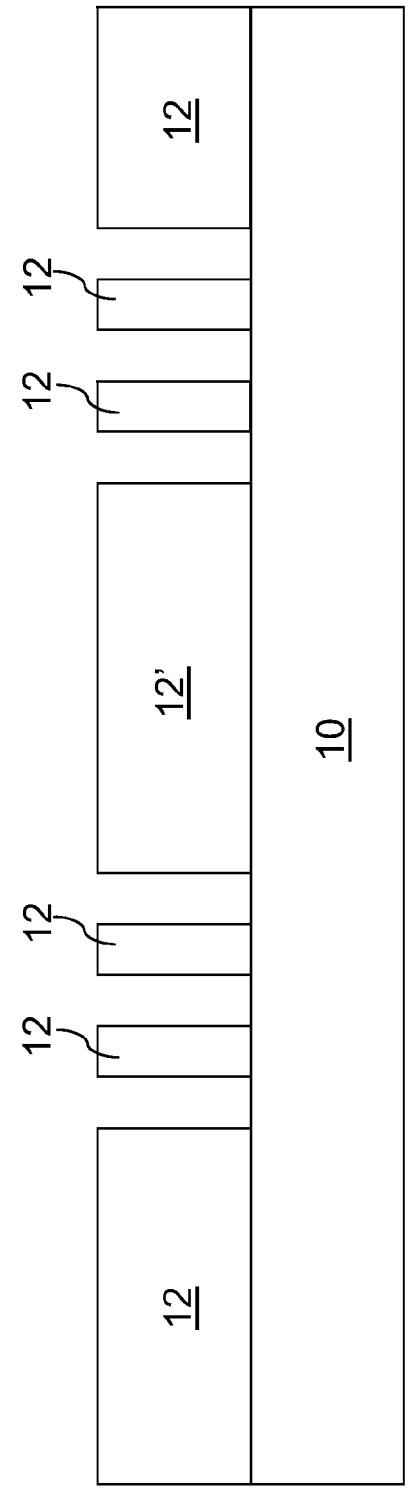

US 8,754,400 B2

TWO-DIMENSIONAL PATTERNING EMPLOYING SELF-ASSEMBLED MATERIAL

CROSS REFERENCE TO RELATED APPLICATION

This application is a divisional of U.S. patent application Ser. No. 12/017,598, now U.S. Pat. No. 8,207,028, filed Jan. 22, 2008 the entire content and disclosure of which is incorporated herein by reference.

FIELD OF THE INVENTION

The present invention relates generally to nanoscale structures, and more particularly to two-dimensional self-assembled sublithographic nanoscale structures in a regular periodic array and methods for manufacturing the same.

BACKGROUND OF THE INVENTION

The use of bottom-up approaches to semiconductor fabrication has grown in interest within the semiconductor industry. One such approach utilizes self-assembling block copolymers for generation of sublithographic ground rule nanometer scale patterns.

Self-assembling copolymer materials that are capable of self-organizing into nanometer-scale patterns may be applied within a recessed region of a template layer to form a nanoscale structure. Under suitable conditions, the two or more immiscible polymeric block components separate into two or more different phases on a nanometer scale, and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Dimensions of the structural units so formed are typically in the range of 5 to 40 nm, which are sublithographic (i.e., below the resolution of the lithographic tools).

The self-assembling block copolymers are first dissolved in a suitable solvent system to form a block copolymer solution, which is then applied onto the surface of an underlayer to form a block copolymer layer. The self-assembling block copolymers are annealed at an elevated temperature to form two sets of polymer block structures containing two different polymeric block components. The polymeric block structure may be lines or cylinders. One set of polymer block structures may be embedded in the other set of polymer block structures, or polymeric block structures belonging to different sets may alternate. The self-assembling block copolymers are non-photosensitive resists, of which the patterning is effected not by photons, i.e., optical radiation, but by self-assembly under suitable conditions such as an anneal.

While self-assembled self-aligned nanoscale structure in a hexagonal array has been known in the art, such a configuration poses geometrical limitations in placement of device components. This is particularly so since most semiconductor device arrays and nanoscale arrays are typically designed in a rectangular array, not in a hexagonal array.

In view of the above, there exists a need for a two dimensional array of self-aligned self-assembled structures in a rectangular array in which the periodicity of the structure propagates along two directions having an angle other than 60 degrees therebetween.

Particularly, there exists a need for a two dimensional rectangular array of structures having sublithographic spacing and width in two orthogonal directions.

SUMMARY OF THE INVENTION

The present invention addresses the needs described above by providing a rectangular array of nanoscale structures having sublithographic width and spacing in two different directions, and methods of manufacturing the same.

A first nanoscale self-aligned self-assembled nested line structure having a sublithographic width and a sublithographic spacing and running along a first direction is formed from first self-assembling block copolymers within a first layer. The first layer is filled with a filler material and a second layer is deposited above the first layer containing the first nanoscale nested line structure. A second nanoscale self-aligned self-assembled nested line structure having a sublithographic width and a sublithographic spacing and running in a second direction is formed from second self-assembling block copolymers within the second layer. The second direction is different from the first direction, and may or may not be orthogonal to the first direction. The composite pattern of the first nanoscale nested line structure and the second nanoscale nested line structure is transferred into an underlayer beneath the first layer to form an array of structures containing periodicity in two directions.

According to an aspect of the present invention, a method of forming a nanoscale pattern on a substrate is provided. The method comprises:

forming a first recessed region having two parallel first lengthwise edges on a first layer on a substrate;

forming a first nanoscale self-assembled self-aligned structure containing at least one first line having a first sublithographic width and having first line edges parallel to the two parallel first lengthwise edges of the first recessed region;

forming a second layer on the first nanoscale self-assembled self-aligned structure and the first layer;

forming a second recessed region having two parallel second lengthwise edges on the second layer, wherein an angle between the two parallel first lengthwise edges and the two parallel second lengthwise edges is greater than zero; and forming a second nanoscale self-assembled self-aligned structure containing at least one second line having a second sublithographic width and having second line edges parallel to the two parallel second lengthwise edges of the first recessed region.

In one embodiment, the first nanoscale self-assembled self-aligned structure is located at or beneath a top surface of the first layer.

In another embodiment, the first nanoscale self-assembled self-aligned structure is located at or beneath a top surface of the second layer.

In even another embodiment, the method comprises applying a first non-photosensitive polymeric resist comprising a first polymeric component and a second polymeric component in the first recessed region, wherein the at least one first line comprises the first polymeric component.

In yet another embodiment, the method further comprises:

forming at least one third line having a third sublithographic width, comprising the second polymeric component, and laterally abutting the at least one first line in the first recessed region; and removing the at least one third line selective to the at least one first line and the first layer.

In still another embodiment, the method further comprises filling a space formed by removal of the at least one third line with a filler material that is different from the first non-photosensitive polymeric resist.

In a further embodiment, the method further comprises applying a second non-photosensitive polymeric resist comprising a third polymeric component and a fourth polymeric component in the second recessed region, wherein the at least one second line comprises the third polymeric component.

In an even further embodiment, the method further comprises:

forming at least one fourth line having a fourth sublithographic width, comprising the fourth polymeric component, and laterally abutting the at least one second line in the second recessed region; and removing the at least one fourth line selective to the at least one second line and the second layer.

In a yet further embodiment, the at least one first line comprises a polymeric component of a first non-photosensitive polymeric resist and the at least one second line comprises a polymeric component of a second non-photosensitive polymeric resist, and the method further comprises removing the second layer selective to the at least one second line.

In a still further embodiment, the method further comprises removing the first layer selective to the at least one first line and the at least one second line.

In a still yet further embodiment, the method further comprises forming a structure comprising a two dimensional array of nanoscale trenches in an underlayer beneath the first layer and on the substrate, wherein the nanoscale trenches are repeated along a first direction and a second direction within the two dimensional array, and wherein each of the nanoscale trenches has a first pair of sidewalls separated by a first sublithographic distance and a second pair of sidewalls separated by a second sublithographic distance.

In further another embodiment, the first direction is perpendicular to the two parallel first lengthwise edges, and wherein the second direction is perpendicular to the two parallel second lengthwise edges.

In even further another embodiment, a horizontal cross-sectional area of the nanoscale trenches is a parallelogram.

In yet further another embodiment, the horizontal cross-sectional area of the nanoscale trenches is a rectangle.

According to another aspect of the present invention, a structure comprising a two dimensional array of nanoscale trenches in a pattern-containing layer is provided, wherein the nanoscale trenches are repeated along a first direction and a second direction within the two dimensional array, and wherein each of the nanoscale trenches has a first pair of parallel sidewalls separated by a first sublithographic distance and a second pair of parallel sidewalls separated by a second sublithographic distance.

In one embodiment, an angle between the first direction and the second direction is the same as an angle between one of the first pair of parallel sidewalls and one of the second pair of parallel sidewalls.

In another embodiment, the angle is between 0 degree and 60 degrees or between 60 degree and 90 degrees.

In even another embodiment, a horizontal cross-sectional area of the nanoscale trenches is a parallelogram.

In yet another embodiment, the horizontal cross-sectional area of the nanoscale trenches is a rectangle.

In still another embodiment, a first spacing between an adjacent pair of the nanoscale trenches in the first direction is sublithographic, and wherein a second spacing between an adjacent pair of the nanoscale trenches in the second direction is sublithographic.

BRIEF DESCRIPTION OF THE DRAWINGS

FIGS. 1A, 1B, 2A, 2B, 3A, 3B, 4A, 4B, 5A, 5B, 6A, 6B, 6C, 7A, 7B, 8A, 8B, 8C, 8D, 9A, 9B, 9C, 10A, 10B, 10C, 11A, 11B, and 11C are sequential views of a first exemplary nanoscale structure according to a first embodiment of the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D', respectively, of the corresponding figure with the same numeric label and the suffix "A".

FIGS. 12A, 12B, 12C, 13A, 13B, 13C, 14A, 14B, and 14C are sequential views of a second exemplary nanoscale structure according to a second embodiment of the present invention. Figures with the same numeric label correspond to the same stage of manufacturing. Figures with the suffix "A" are top-down views. Figures with the suffix "B" or "C" are vertical cross-sectional views along the plane B-B' or C-C', respectively, of the corresponding figure with the same numeric label and the suffix "A".

DETAILED DESCRIPTION OF THE INVENTION

Figure 1A:
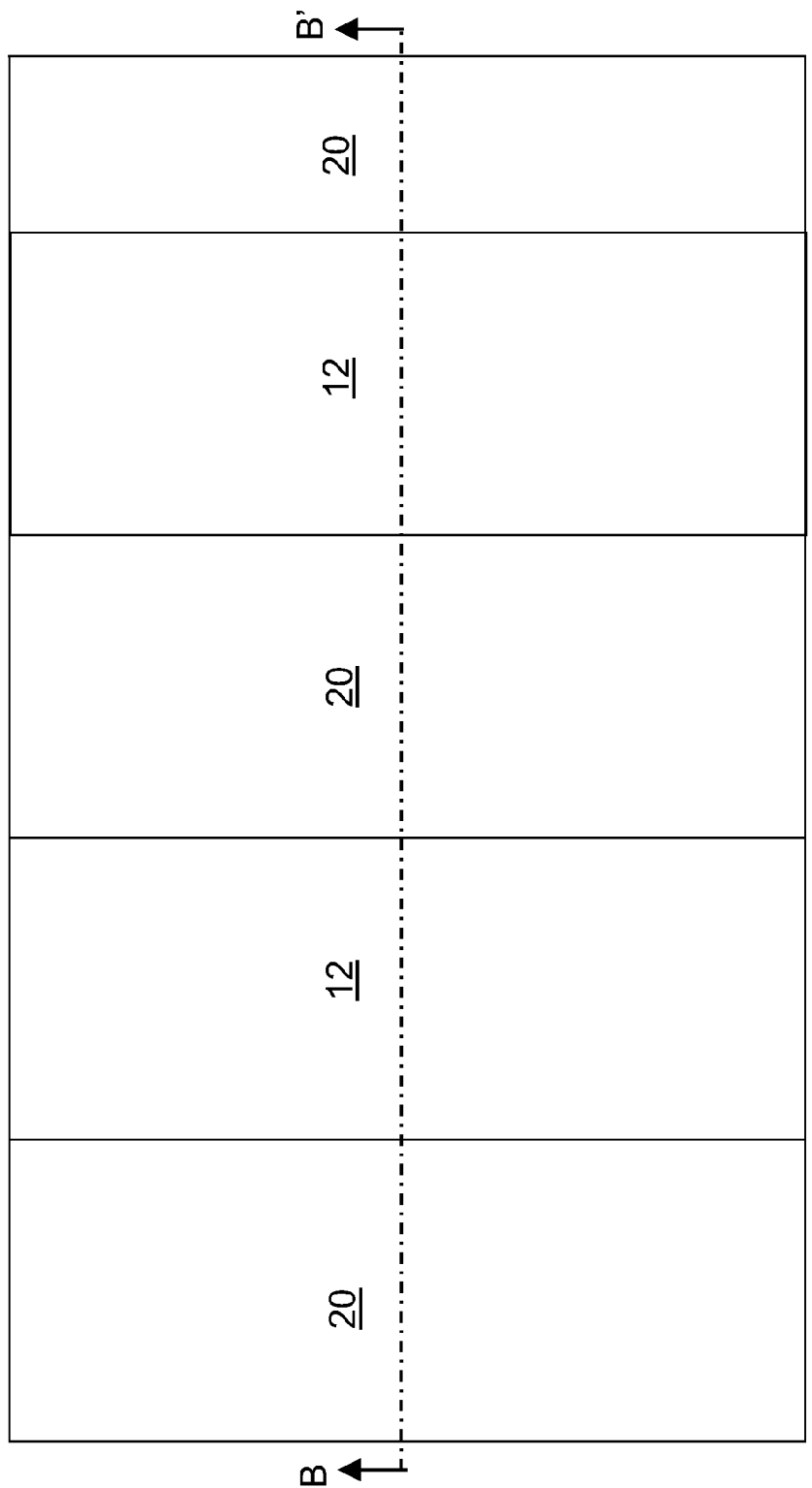

As stated above, the present invention relates to two-dimensional self-assembled sublithographic nanoscale structures in a regular periodic array and methods for manufacturing for the same, which are now described in detail with accompanying figures. It is noted that like and corresponding elements are referred to by like reference numerals.

Figure 1B:
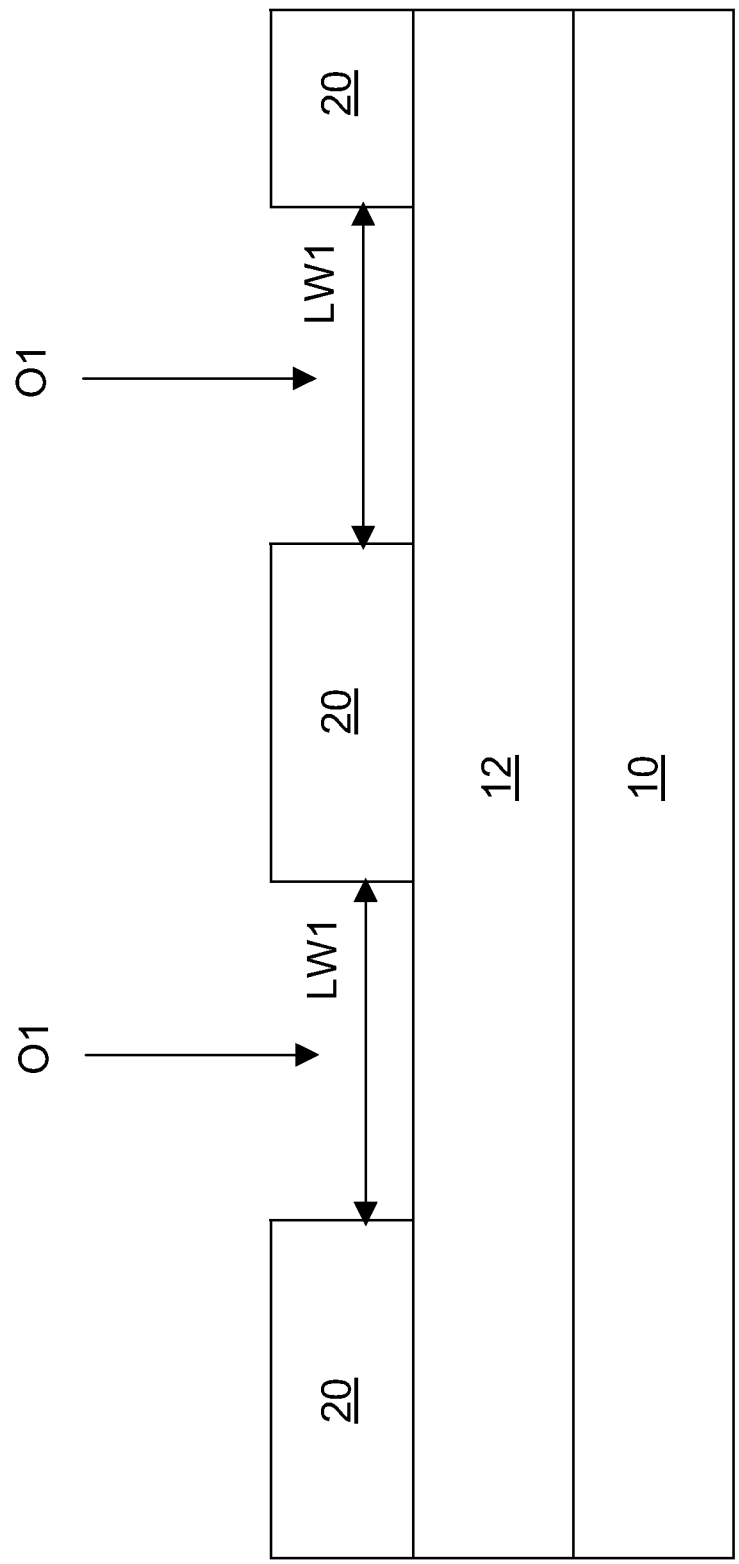

Referring to FIGS. 1A and 1B, a first exemplary nanoscale structure according to a first embodiment of the present invention comprises an underlayer 12 located on a substrate 10 and a first layer 20. The substrate 10 may be a semiconductor substrate, an insulator substrate, a metallic substrate, or a combination thereof. The semiconductor substrate may be a silicon substrate, other group IV element semiconductor substrate, or a compound semiconductor substrate. Also, the semiconductor substrate may be a bulk substrate, a semiconductor-on-insulator (SOI) substrate, or a hybrid substrate having a bulk portion and an SOI portion.

The underlayer 12 may comprise a semiconductor material, an insulator material, or a metal. Exemplary material for the semiconductor material comprises group IV elements as a pure material or as an alloy, III-V compound semiconductor materials, and II-VI compound semiconductor materials. The semiconductor material may be doped with dopants, or may be substantially undoped. Exemplary insulator materials include a dielectric oxide, a dielectric nitride, and a porous or non-porous low-dielectric constant dielectric material (having a dielectric constant less than the dielectric constant of silicon oxide, i.e., less than 3.9) known in the art. The metal may be a pure metal, an alloy of elemental metals, a metal semiconductor alloy, or any other conductive metal compound.

The first layer 20 may comprise a semiconductor material or an insulator material. Exemplary semiconductor materials include polysilicon, amorphous silicon, a polycrystalline silicon containing alloy that includes germanium or carbon, or an amorphous silicon containing alloy that includes germanium or silicon. Exemplary insulator materials include a dielectric oxide, a dielectric oxynitride, a dielectric nitride, and a porous or non-porous low dielectric constant insulator material (having a dielectric constant less than the dielectric constant of silicon oxide, i.e., 3.9). Further, the first layer 20, which is a template for the self-assembling block copolymers, may comprise amorphous carbon or diamond-like carbon such as hydrogen-free amorphous carbon, tetrahedral hydrogen-free amorphous carbon, metal-containing hydrogen-free amorphous carbon, hydrogenated amorphous carbon, tetrahedral hydrogenated amorphous carbon, metal-containing hydrogenated amorphous carbon, and modified hydrogenated amorphous carbon. The thickness of the first layer 20, which may vary, is typically from about 3 nm to about 300 nm, and typically from about 10 nm to about 100 nm.

The first layer 20 is first formed as a blanket layer covering the entirety of a top surface of the underlayer 12, and subsequently patterned by lithographic methods employing application of a photoresist (not shown), patterning of the photoresist, and an anisotropic etch that transfers the pattern in the photoresist into the first layer 20. The pattern contains first openings O1 in the first layer 20 beneath which the top surface of the underlayer 12 is exposed. The first lateral width LW1 of first openings O1 is lithographic. Further, the spacing between adjacent first openings O1 is also lithographic. Each of the first openings O1 has a shape of a rectangle or a parallelogram, and thus has two lengthwise edges that are longer than widthwise edges. Preferably, the length of the first openings O1, which is the length of the lengthwise edges of the first openings O1, is an order of magnitude or more longer than the width of the first openings O1, which is the product of the length of the widthwise edges of the first openings O1 and the sine of the angle of one of the corners of the first openings O1.

Since the first openings O1 are formed by lithographic methods, the length and the width of each of the first openings O1 are lithographic dimensions. Whether a dimension is a lithographic dimension or a sublithographic dimension depends on whether the dimension may be formed by lithographic patterning methods. The minimum dimension that may be formed by lithographic patterning methods is herein referred to as a "lithographic minimum dimension," or a "critical dimension." While the lithographic minimum dimension is defined only in relation to a given lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 45 nm and is expected to shrink in the future. A dimension less than the lithographic minimum dimension is a sublithographic dimension, while a dimension equal to or greater than the lithographic minimum dimension is a lithographic dimension.

Figure 2A:
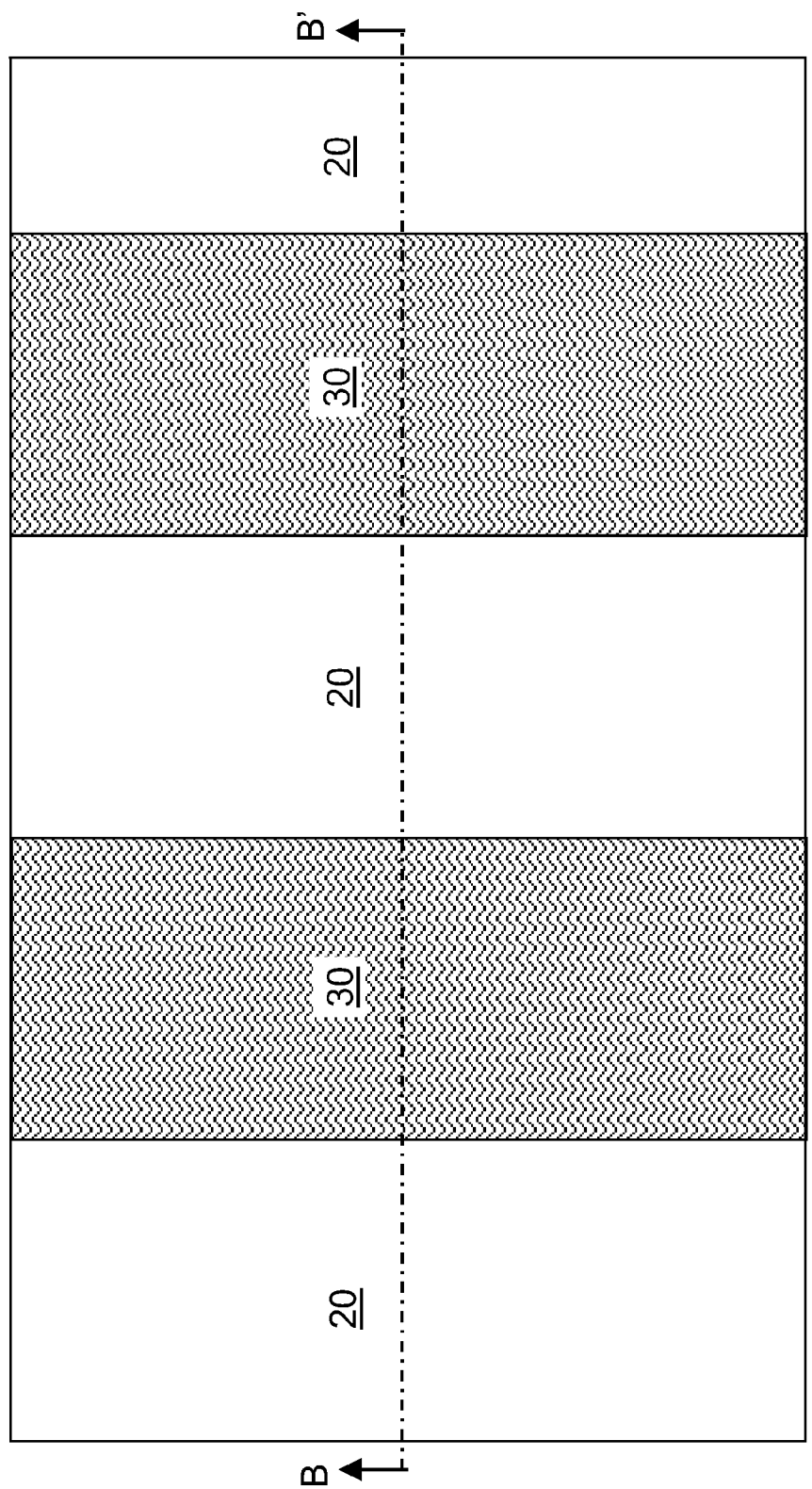
Figure 2B:
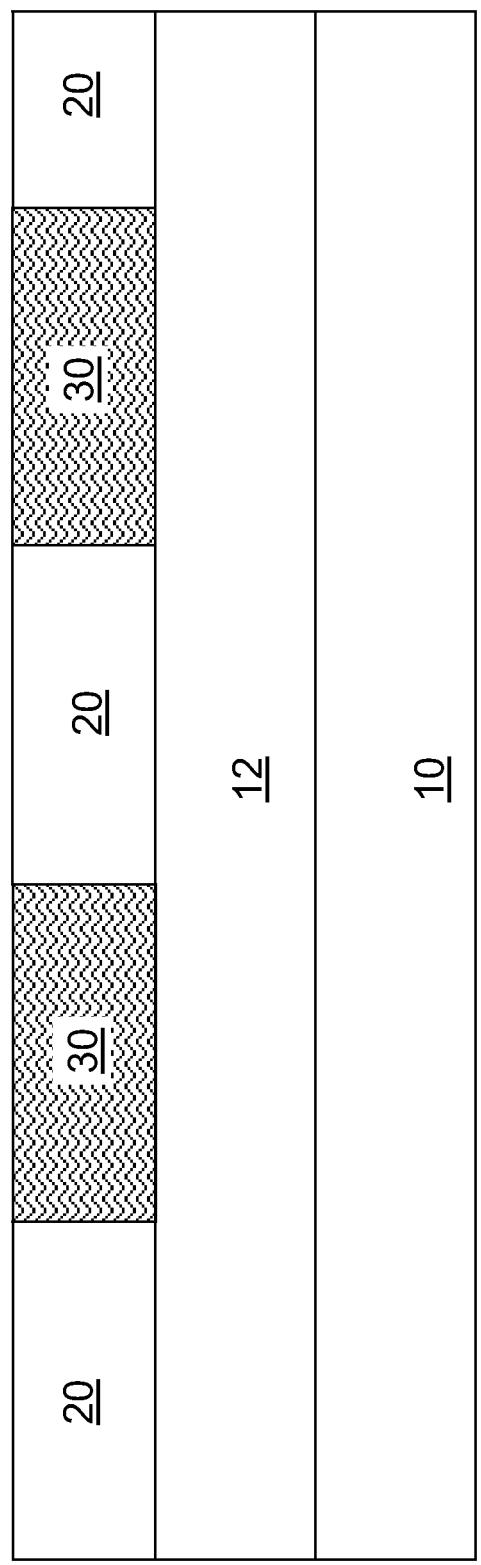

Referring to FIGS. 2A and 2B, a first non-photosensitive polymeric resist is applied within each of the first openings O1 by methods well known in the art, such as spin coating to form first non-photosensitive polymeric resist portions 30. The top surface of the first non-photosensitive polymeric resist portions 30 may be coplanar with the top surface of the first layer 20, or may be recessed below a top surface of the first layer 20. The first non-photosensitive polymeric resist comprises self-assembling block copolymers that are capable of self-organizing into nanometer-scale patterns.

The first non-photosensitive polymeric resist comprises a first polymeric block component and a second polymeric block component that are immiscible with each other. The non-photosensitive polymeric resist may be self-planarizing. Alternatively, the non-photosensitive polymeric resist may be planarized by chemical mechanical planarization, a recess etch, or a combination thereof.

Exemplary materials for the first polymeric block component and the second polymeric block component are described in commonly-assigned, copending U.S. patent application Ser. No. 11/424,963, filed on Jun. 19, 2006, the contents of which are incorporated herein by reference. Specific examples of self-assembling block copolymers for the non-photosensitive polymeric resist that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The self-assembling block copolymers are first dissolved in a suitable solvent system to form a block copolymer solution, which is then applied onto the surface of the first exemplary structure to form the non-photosensitive polymeric resist. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The non-photosensitive polymeric resist is not a conventional photoresist that may be developed upon exposure to ultraviolet light or optical light. Also, the non-photosensitive polymeric resist is not a conventional low-k dielectric material.

Figure 3B:
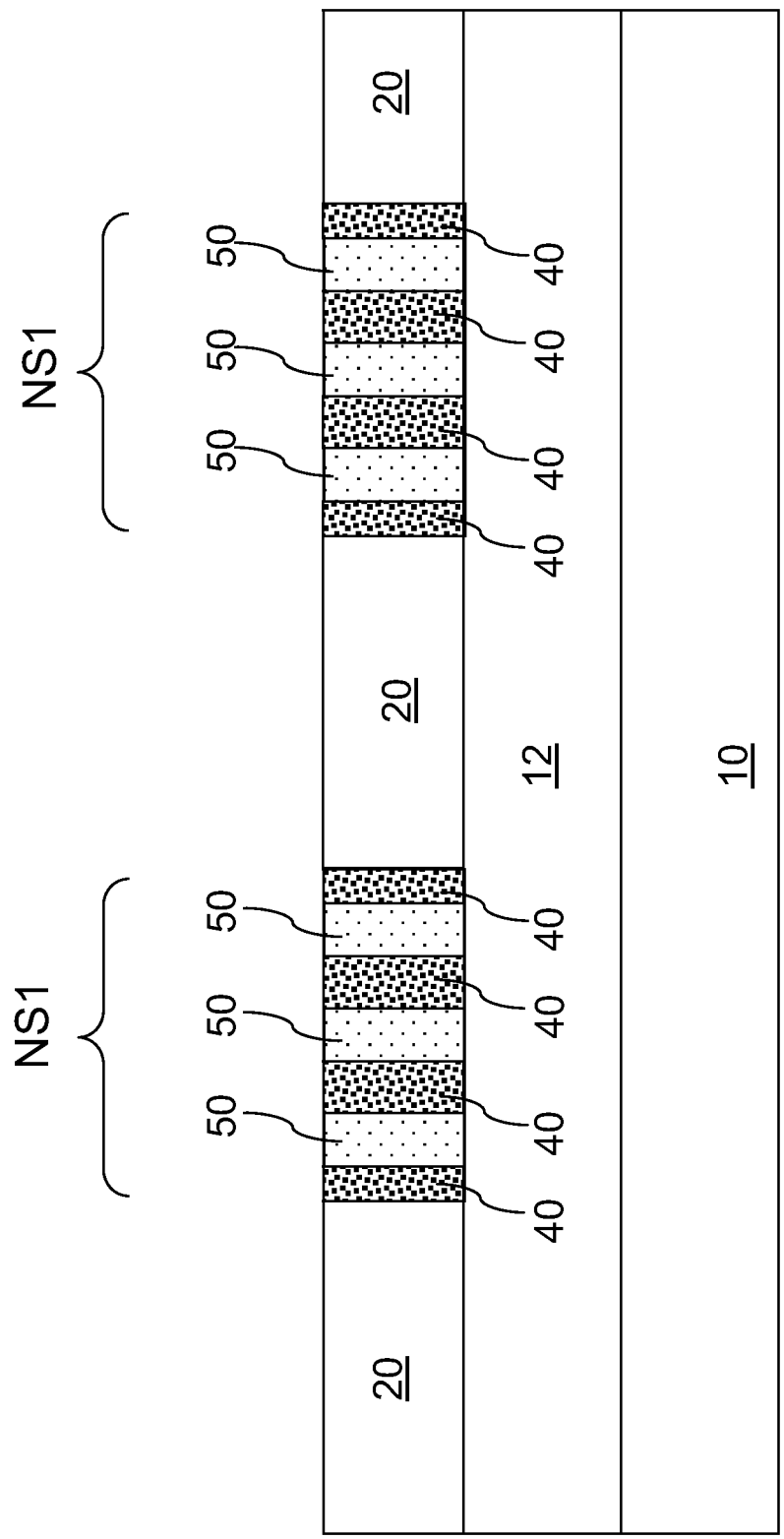

Referring to FIGS. 3A and 3B, a first nanoscale self-assembled self-aligned structure NS1 is formed within each of the first openings O1 (See FIG. 1B) by causing cross-linking of the self-assembling block copolymers through annealing. Specifically, the first non-photosensitive polymeric resist is annealed by ultraviolet treatment or by thermal annealing at an elevated temperature to form first primary lamellar structures 40 comprising the first polymeric block component and first complementary lamellar structures 50 comprising the second polymeric block component. The first primary lamellar structure 40 and the first complementary lamellar structures 50 alternate with periodicity in the direction perpendicular to the lengthwise direction of the first openings O1.

Exemplary processes of annealing the self-assembling block copolymers in the block copolymer layer to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Methods of annealing described in the '963 Application may be employed. The anneal may be performed, for example, at a temperature from about 200° C. to about 300° C. for a duration from less than about 1 hour to about 100 hours.

The composition and wetting properties of the first non-photosensitive polymeric resist is adjusted such that some of the first primary lamellar structures 40 abut the sidewalls of the first layer 20, while the first complementary lamellar structures 50 are disjoined from the sidewalls of the first layer 20. The wetting characteristics of the first polymeric block component may be tuned so that the width of a first primary lamellar structure 40 depends on whether the first primary lamellar structure 40 contacts the sidewalls of the first layer 20 or not. For example, the width of a first primary lamellar structure 40 that does not contact the sidewalls of the first layer 20 may be the same as, or different from, the width of a first primary lamellar structure 40 that contacts the sidewalls of the first layer 20. The width of the first primary lamellar structures 40 may be sublithographic, and in the range from about 1 nm to about 40 nm, and typically from about 5 nm to about 30 nm. The width of the first complementary lamellar structures 50, which is herein referred to as a first lamellar spacing, may be sublithographic. The sum of the width of one of the first primary lamellar structures 40 and the first lamellar spacing may also be sublithographic.

The first nanoscale self-assembled self-aligned structures NS1 are "self-assembled." The chemical composition of the first non-photosensitive polymeric resist is such that the immiscibility of the first and second polymeric block components enable self assembly of the first polymeric block component into the first primary lamellar structures 40 and the second polymeric block component assembles into the first complementary lamellar structures 50.

The first nanoscale self-assembled self-aligned structures NS1 are "self-aligned" to the walls of the first layer 20 that define the first openings O1. The first primary lamellar structures 40 and first complementary lamellar structures 50 run along the lengthwise direction of the first openings O1 in the first layer 20.

Figure 4A:
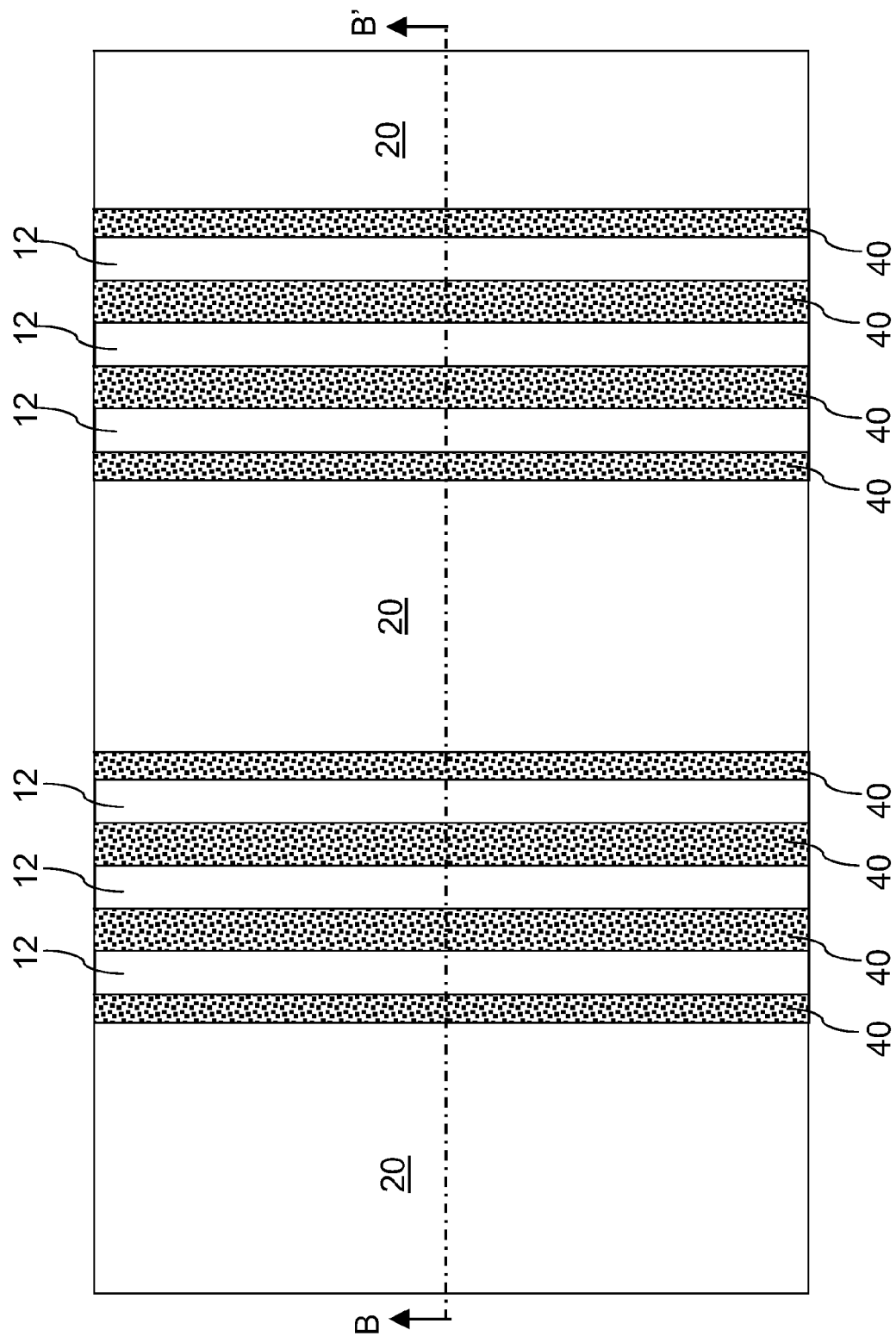
Figure 4B:
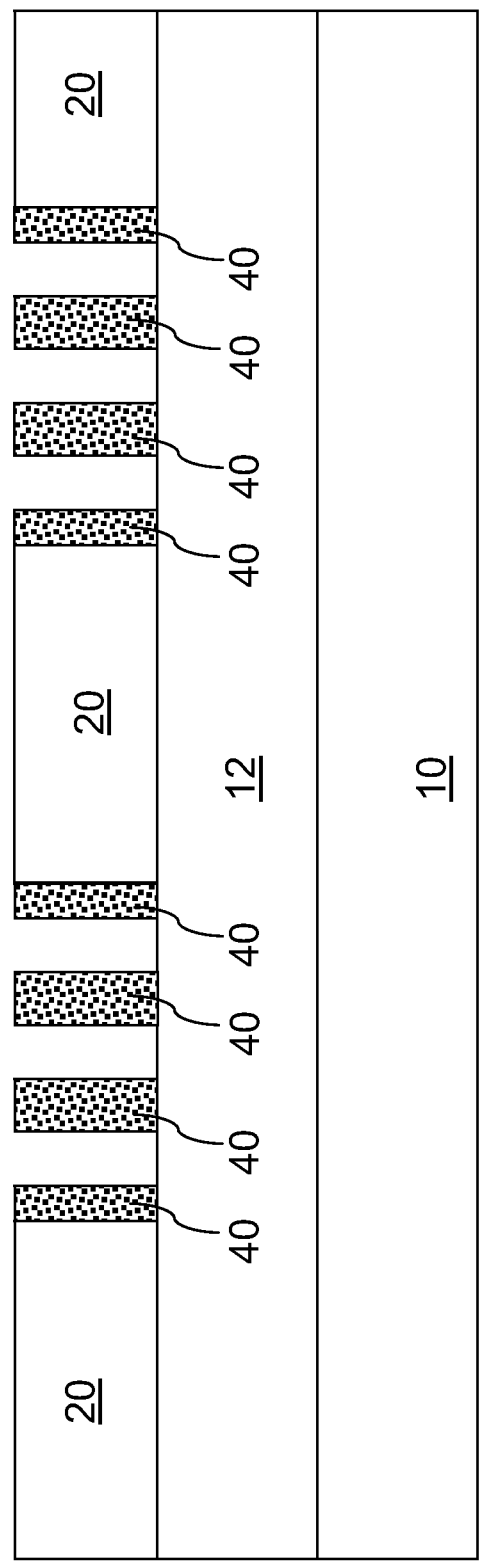

Referring to FIGS. 4A and 4B, the first complementary lamellar structures 50 are removed selective to the first primary lamellar structures 40 and the first layer 20 by an anisotropic etch that removes the second polymeric block component selective to the first polymeric block component. A set of first primary lamellar structures 40 constitutes within each of the first openings O1 (See FIG. 1B) constitutes a first one dimensional arrays of parallel lines having a sublithographic width and a sublithographic spacing. Variations of the present invention in which the first primary lamellar structures 40 are removed selective to the first complementary lamellar structures 50 and the first layer 20 by an anisotropic etch that removes the first polymeric block component selective to the second polymeric block component are explicitly contemplated herein.

Figure 5B:
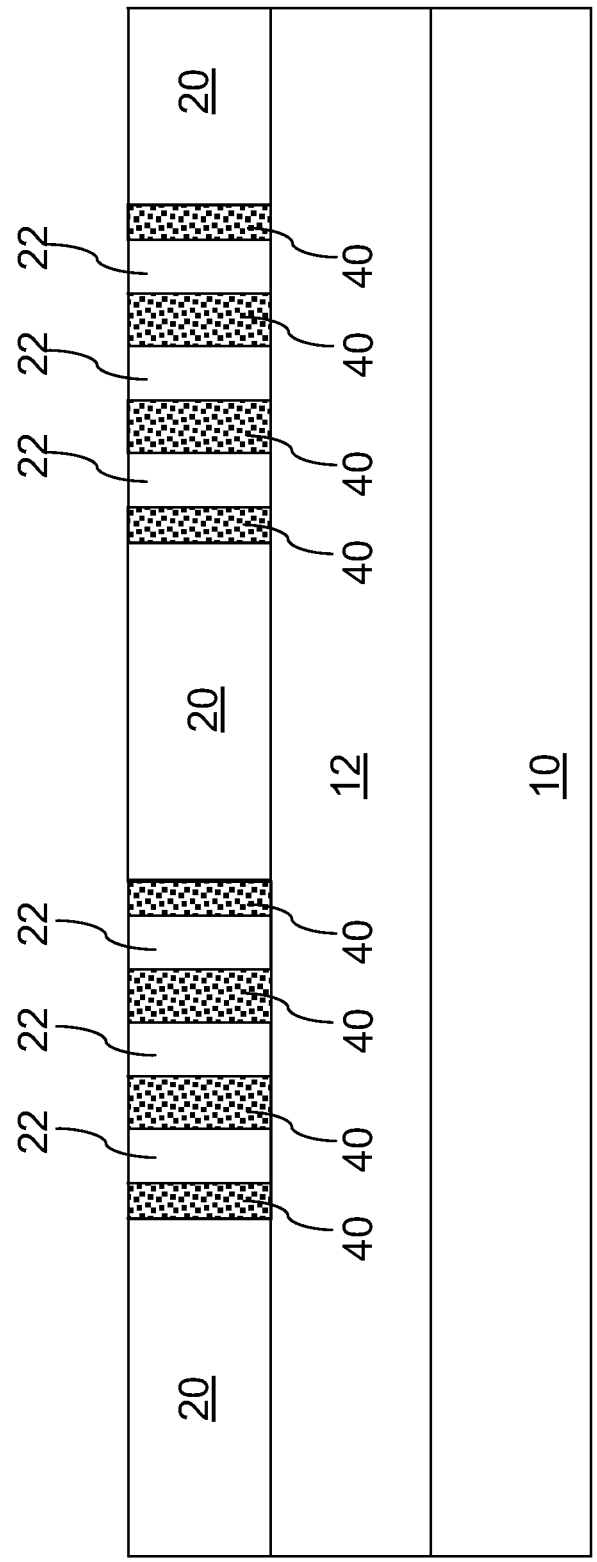

Referring to FIGS. 5A and 5B, filler portions 22 are formed between the first primary lamellar structures 40. The filler portions 22 comprise a material that may be removed selective to the first primary lamellar structures 40 comprising the first polymeric block component. For example, the filler portions may comprise a dielectric oxide, a dielectric nitride, or a porous or non-porous low dielectric constant material (having a dielectric constant less than the dielectric constant of silicon oxide, i.e., 3.9). The filler portions 22 may be formed by spin-on coating, deposition and recess etch, deposition and chemical mechanical planarization (CMP), or a combination thereof.

Figure 6A:
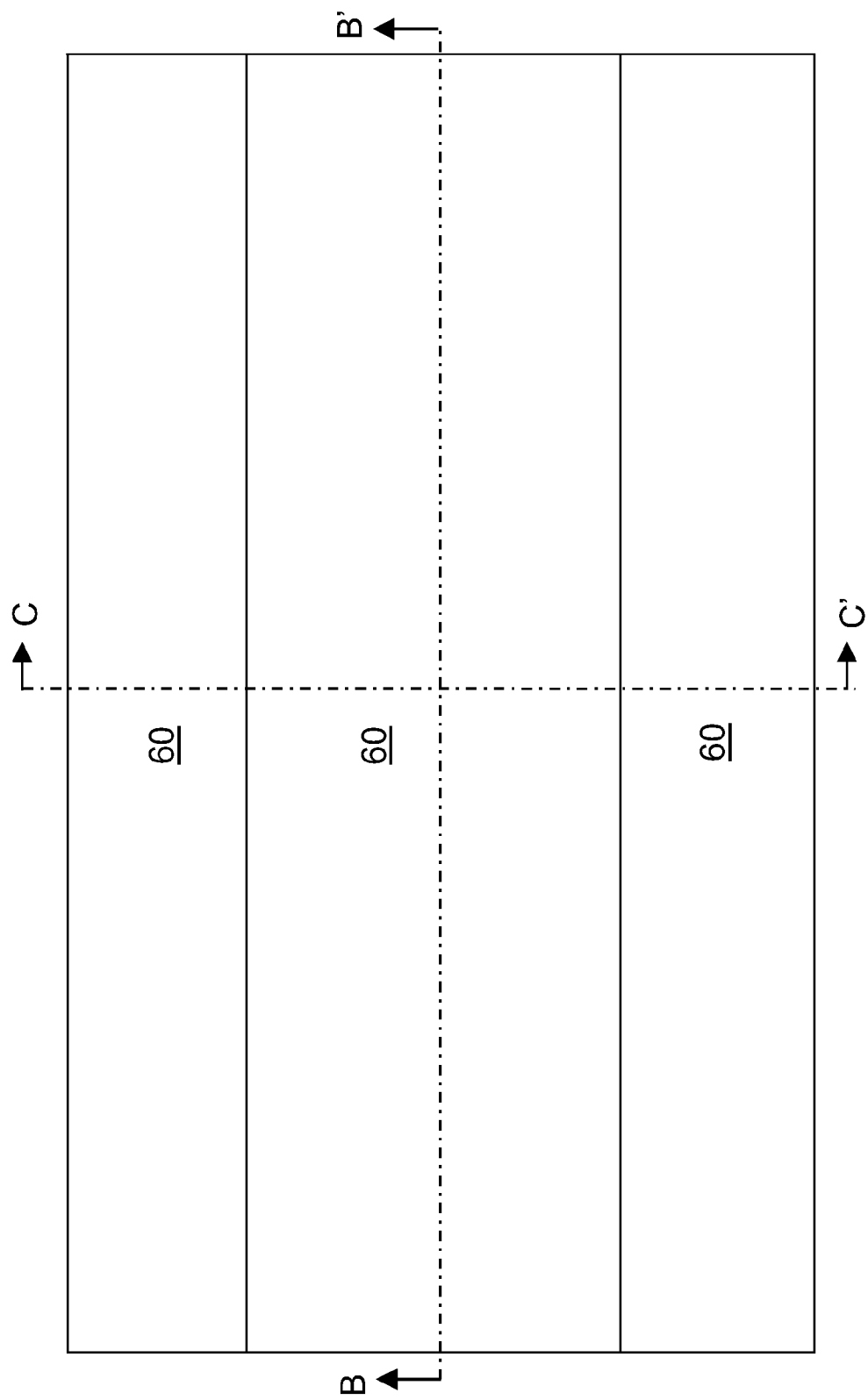
Figure 6B:
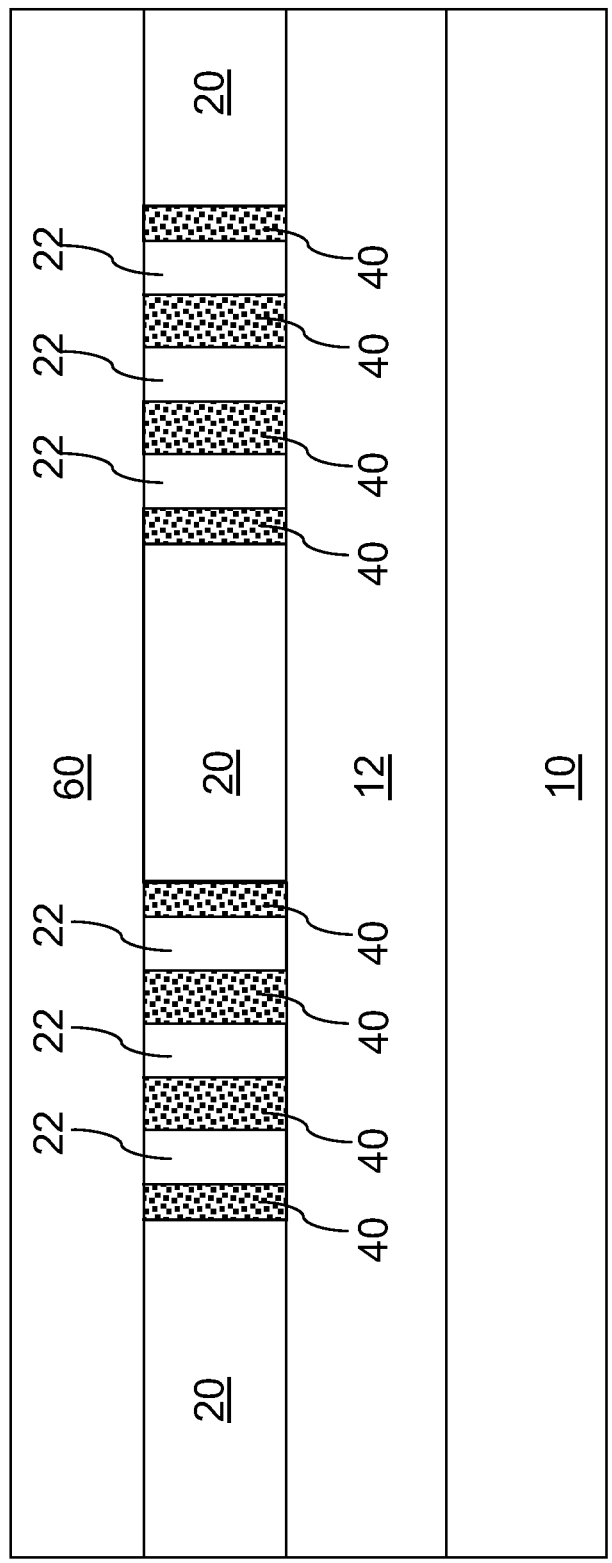
Figure 6C:
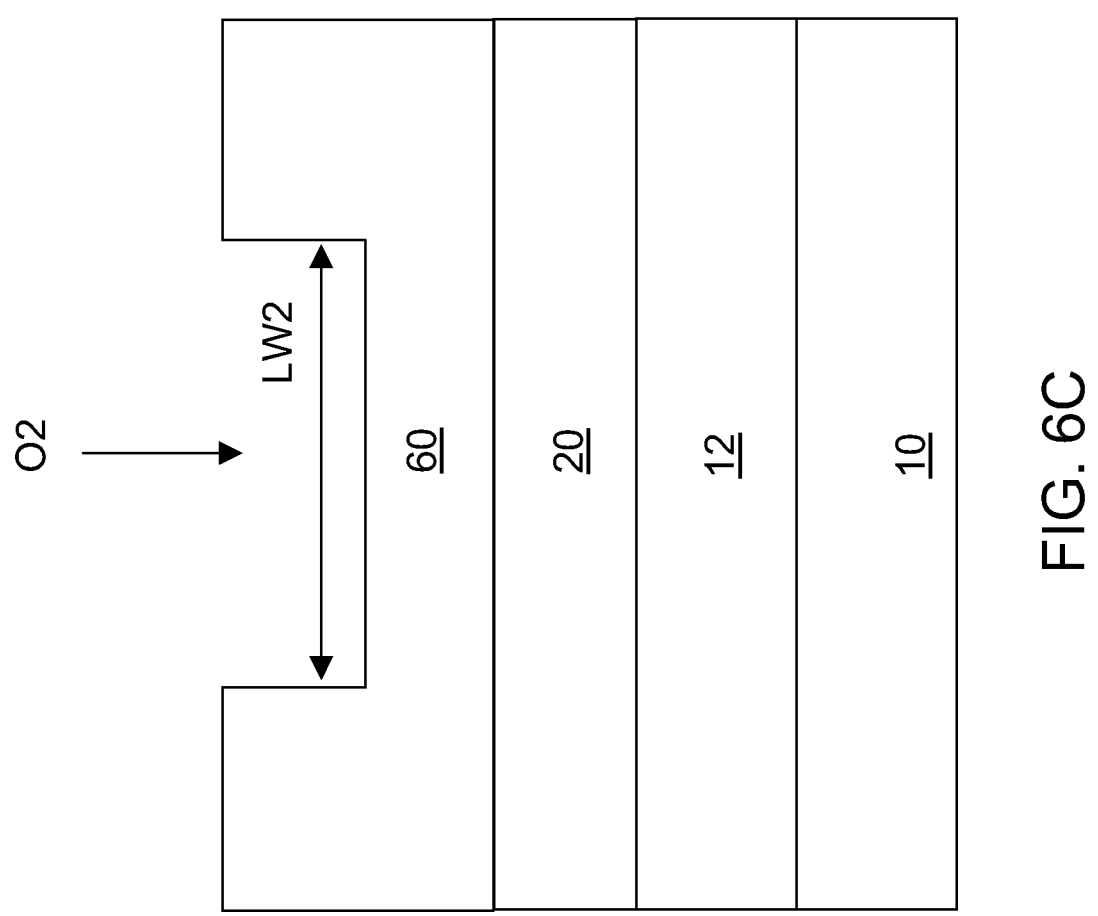

Referring to FIGS. 6A-6C, a second layer 60 is formed as a blanket layer directly on the first layer 20, the first primary lamellar structures 40, and the filler portions 22. The second layer 60 may comprise any of the material that may be employed as the first layer 20. Specifically, the second layer 60 may comprise a semiconductor material, an insulator material, amorphous carbon, or diamond-like carbon. A spin-on coating or chemical vapor deposition may be employed to form the second layer 60. The thickness of the second layer 60 may be from about 3 nm to about 600 nm, and typically from about 10 nm to about 200 nm.

In a variation of the first embodiment, the filler portion 22 and the second layer 60 may comprise the same material, and may be formed at the same processing step by forming the second layer 60 between the first primary lamellar structures 40. In this case, the filler portion 22 and the second layer 60 are integrally formed without any manifested physical interface therebetween.

The second layer 60 is patterned by lithographic methods employing application of a photoresist (not shown), patterning of the photoresist, and an anisotropic etch that transfers the pattern in the photoresist into the second layer 60. The pattern contains a second opening O2 in the second layer 20. The second opening O2 may be formed through the second layer 60 to expose a top surface of the first layer 20, the first primary lamellar structures 40, and the filler portions 22, or alternately, may be formed only partly into the second layer 60 without exposing a top surface of the first layer 20.

A second lateral width LW2, which is the lateral width of the second opening O2, is lithographic. More than one second opening O2 may be formed. In such a case, the spacing between adjacent second openings O2 is also lithographic. The second opening O2 has a shape of a rectangle or a parallelogram, and thus has two lengthwise edges that are longer than widthwise edges. Preferably, the length of the second opening O2, which is the length of the lengthwise edges of the second openings O2, is an order of magnitude or more longer than the width of the second opening O2, which is the product of the length of the widthwise edges of the second opening O2 and the sine of the angle of one of the corners of the second opening O2. Since the second opening O2 is formed by lithographic methods, the length and the width of the second opening are lithographic dimensions.

Figure 7A:
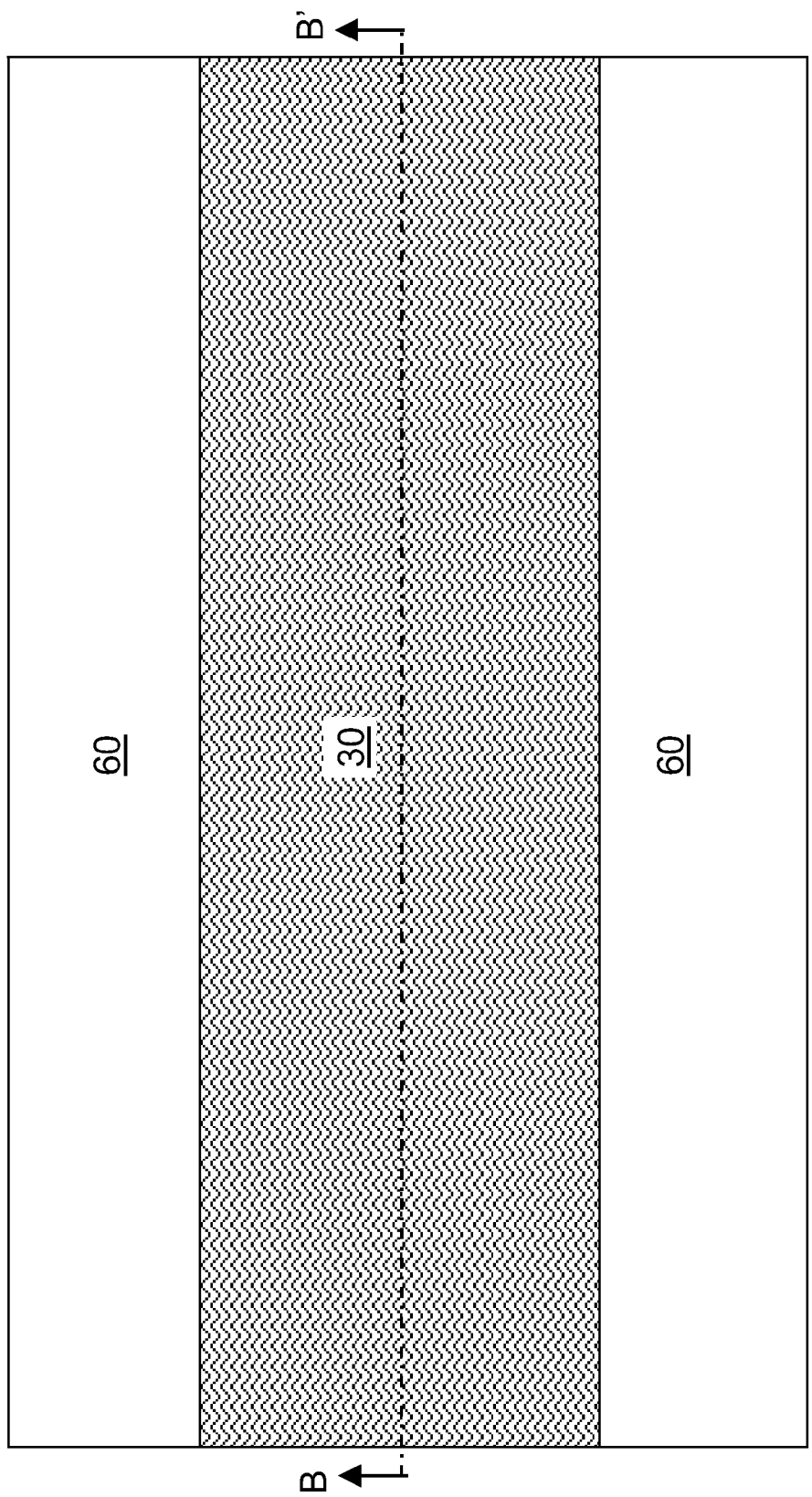
Figure 7B:
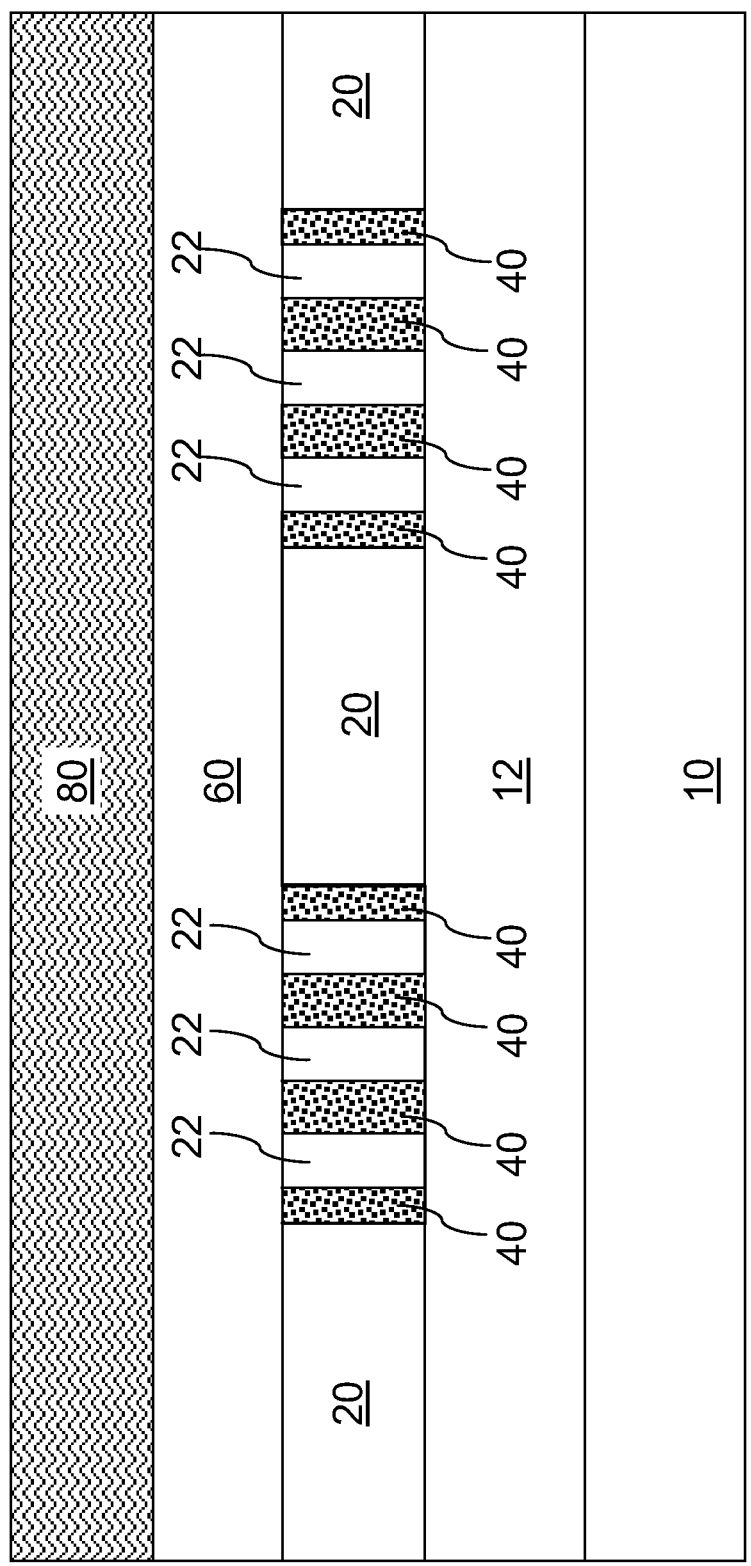
Figure 8A:
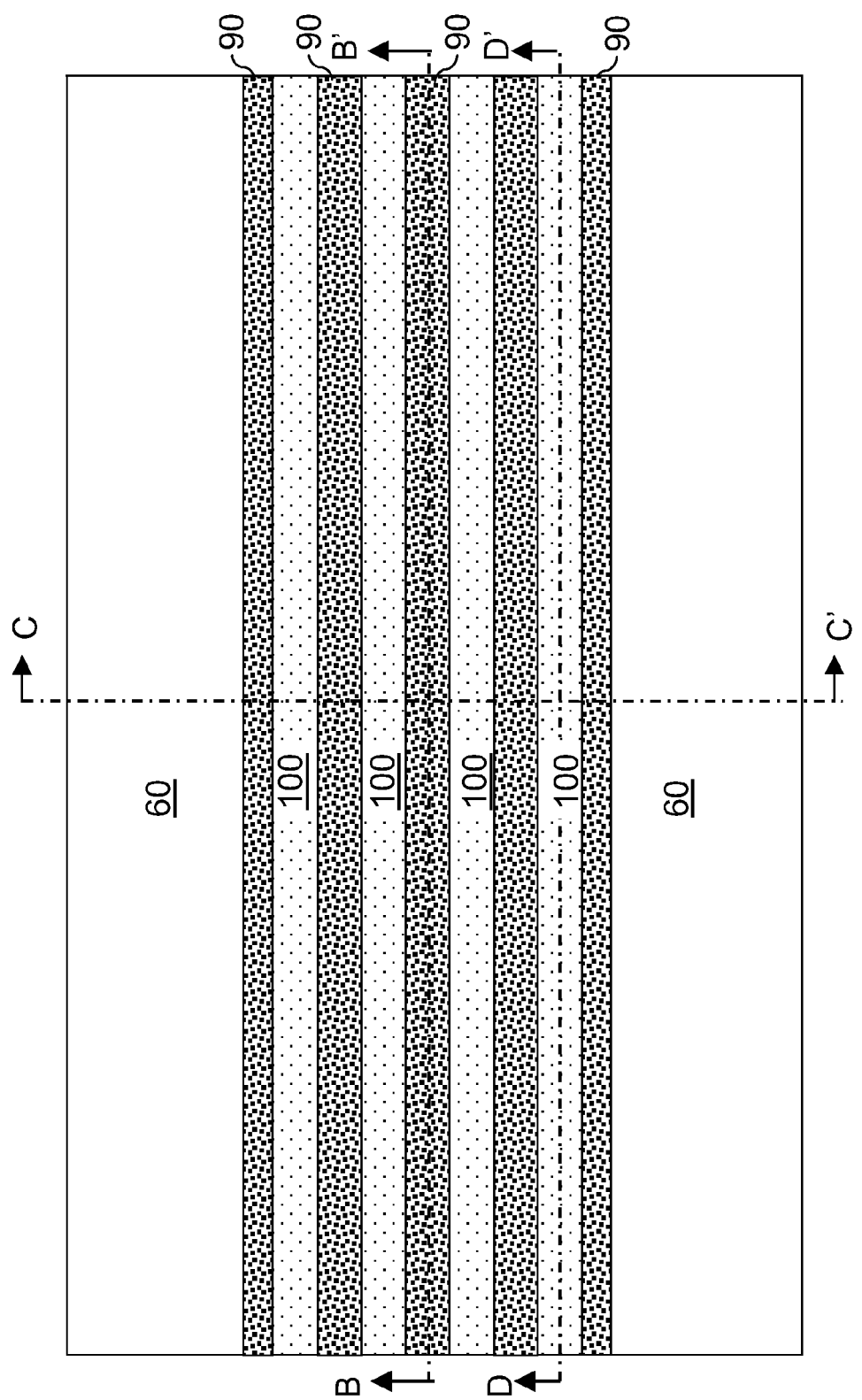
Figure 8B:
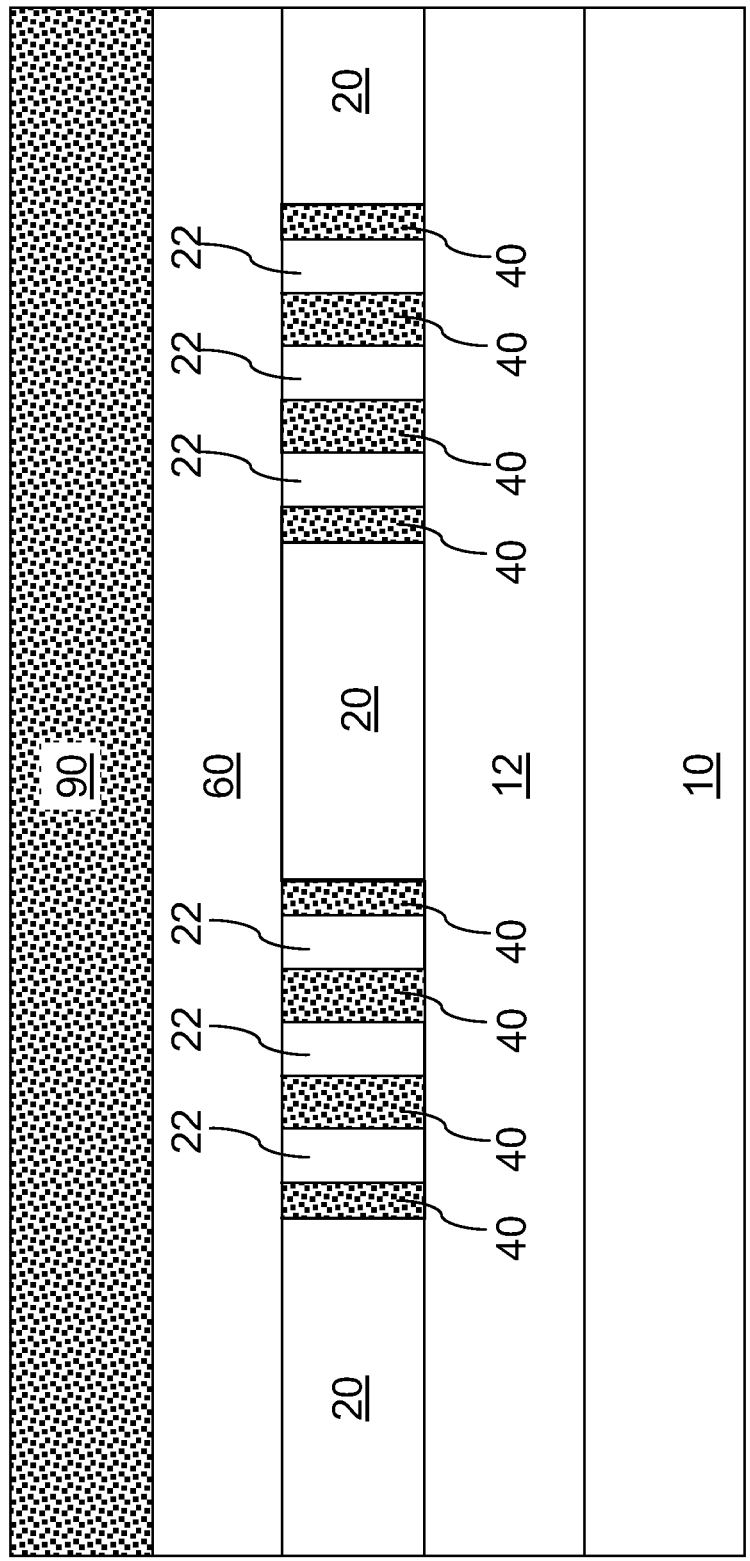
Figure 8D:
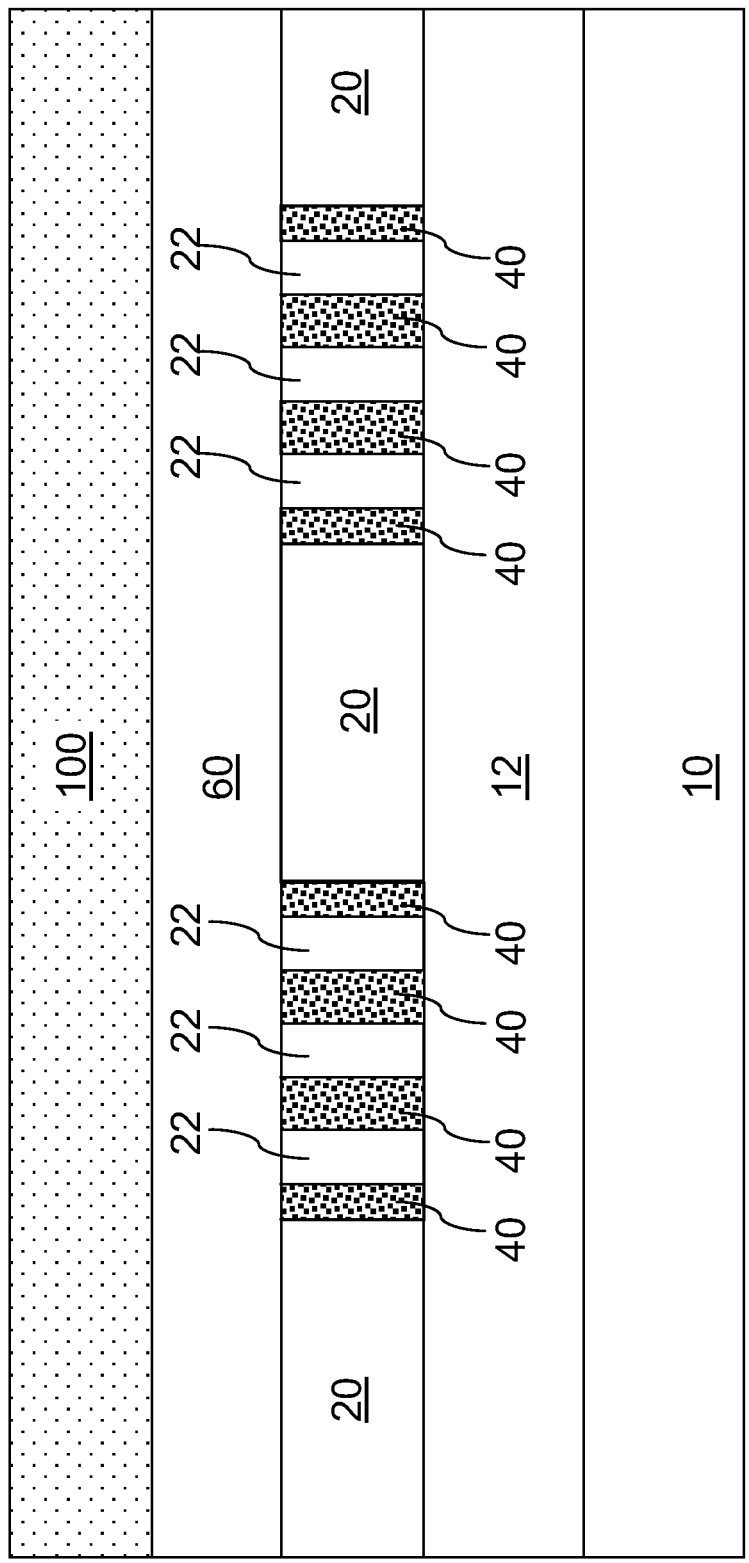

Referring to FIGS. 7A and 7B, a second non-photosensitive polymeric resist is applied within the second opening O2 by methods well known in the art, such as spin coating to form second non-photosensitive polymeric resist portions 80. Preferably, the top surface of the second non-photosensitive polymeric resist portions 80 may be recessed below, or substantially level with, the top surface of the second layer 60 outside the second opening O2. The second non-photosensitive polymeric resist may be applied to be coplanar with, or above, the top surfaces of the second layer 60, and then recessed to a final height by a recess etch, or by employing a dilute solution from which subsequent evaporation of a solvent causes volume contraction within the second opening O2.

The second non-photosensitive polymeric resist comprises self-assembling block copolymers that are capable of self-organizing into nanometer-scale patterns. Thus, any of the material listed above for the first non-photosensitive polymeric resist may be employed for the second non-photosensitive polymeric resist. The second non-photosensitive polymeric resist may comprise the same material as, or a different material from the first photosensitive polymeric resist. For the purposes of illustrating the present invention, the polymeric block components of the second non-photosensitive polymeric resist are referred to as a third polymeric block component and a fourth polymeric block component. The third polymeric block component may be the same as, or different from, the first polymeric block component. Likewise, the fourth polymeric block component may the sane as, or different from, the second polymeric block component.

Referring to FIGS. 8A-8D, a second nanoscale self-assembled self-aligned structure NS2 is formed within the second opening O2 by causing cross-linking of the self-assembling block copolymers through annealing. The same method employed for the formation of the first nanoscale self-assembled self-aligned structure NS1 may be employed to form the second nanoscale self-assembled self-aligned structures NS2.

Specifically, the second non-photosensitive polymeric resist is annealed by ultraviolet treatment or by thermal annealing at an elevated temperature to form second primary lamellar structures 90 comprising the third polymeric block component and second complementary lamellar structures 100 comprising the fourth polymeric block component. The second primary lamellar structure 90 and the second complementary lamellar structures 100 alternate with periodicity in the direction of the second lateral width LW2, i.e., in the direction perpendicular to the lengthwise edges of the second opening O2.

The composition and wetting properties of the second non-photosensitive polymeric resist is adjusted such that some of the second primary lamellar structures 90 abut the sidewalls of the second opening O2 in the second layer 60, while the second complementary lamellar structures 100 are disjoined from the sidewalls of the second opening O2 in the second layer 60. The wetting characteristics of the third polymeric block component is tuned so that the width of a second primary lamellar structure 90 abutting the sidewalls of the second opening O2 in the second layer 60 may be the same as, or different from, the width of another second primary lamellar structure 90 disjoined from the sidewalls of the second opening O2 in the second layer 60.

The width of the second primary lamellar structures 90 may be sublithographic, and in the range from about 1 nm to about 40 nm, and typically from about 5 nm to about 30 nm. The width of the second complementary lamellar structures 100, which is herein referred to as a second lamellar spacing, may be sublithographic. The sum of the width of one of the second primary lamellar structures 90 and the second lamellar spacing may also be sublithographic.

The second nanoscale self-assembled self-aligned structures NS2 are self-assembled and self-aligned in the same sense that the first nanoscale self-assembled self-aligned structures NS1 are self-assembled and self-aligned, since the same mechanism is employed for the self-assembly and self-alignment of the various components of the second nanoscale self-assembled self-aligned structures NS2.

Figure 9A:
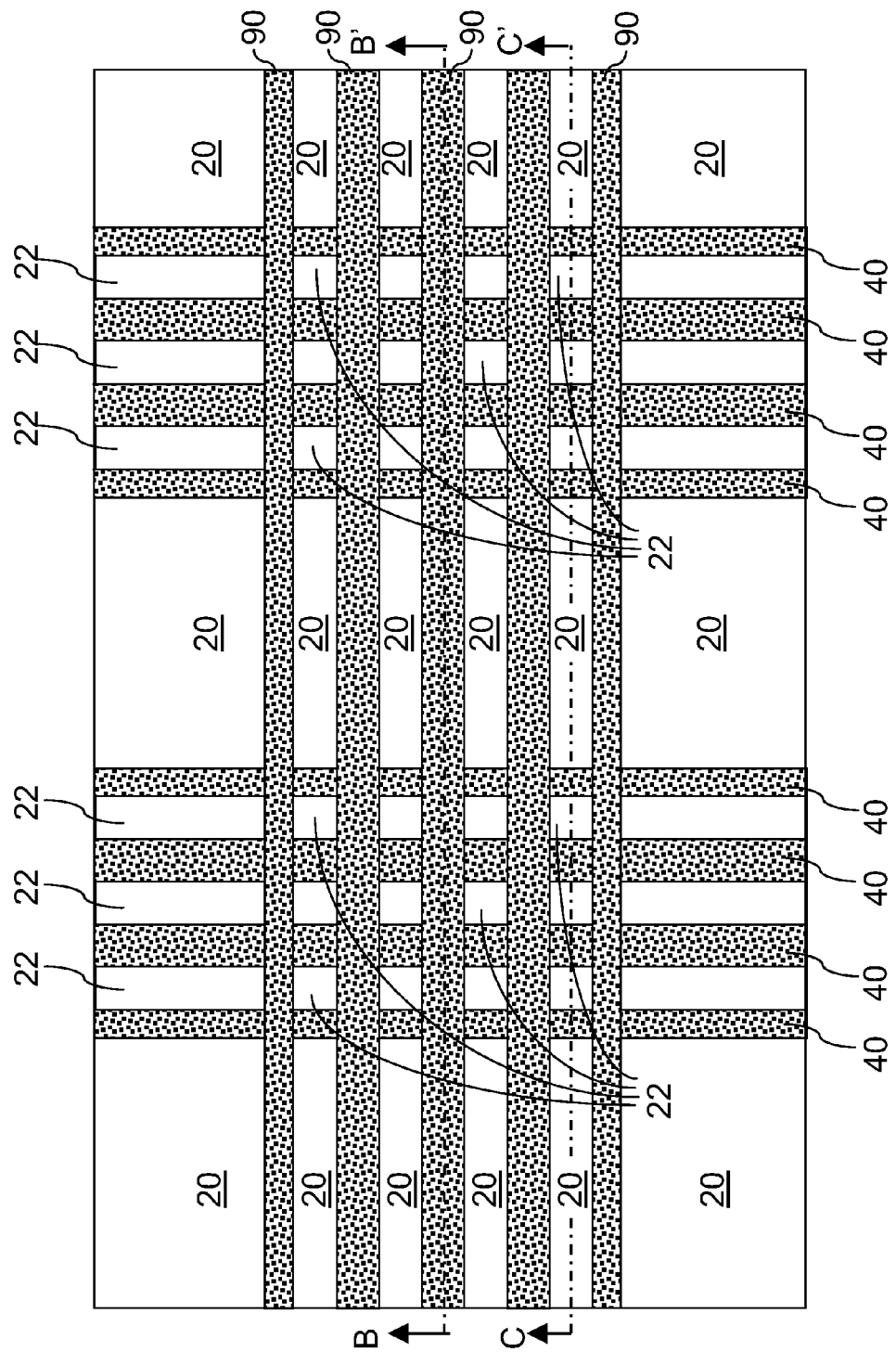
Figure 9B:
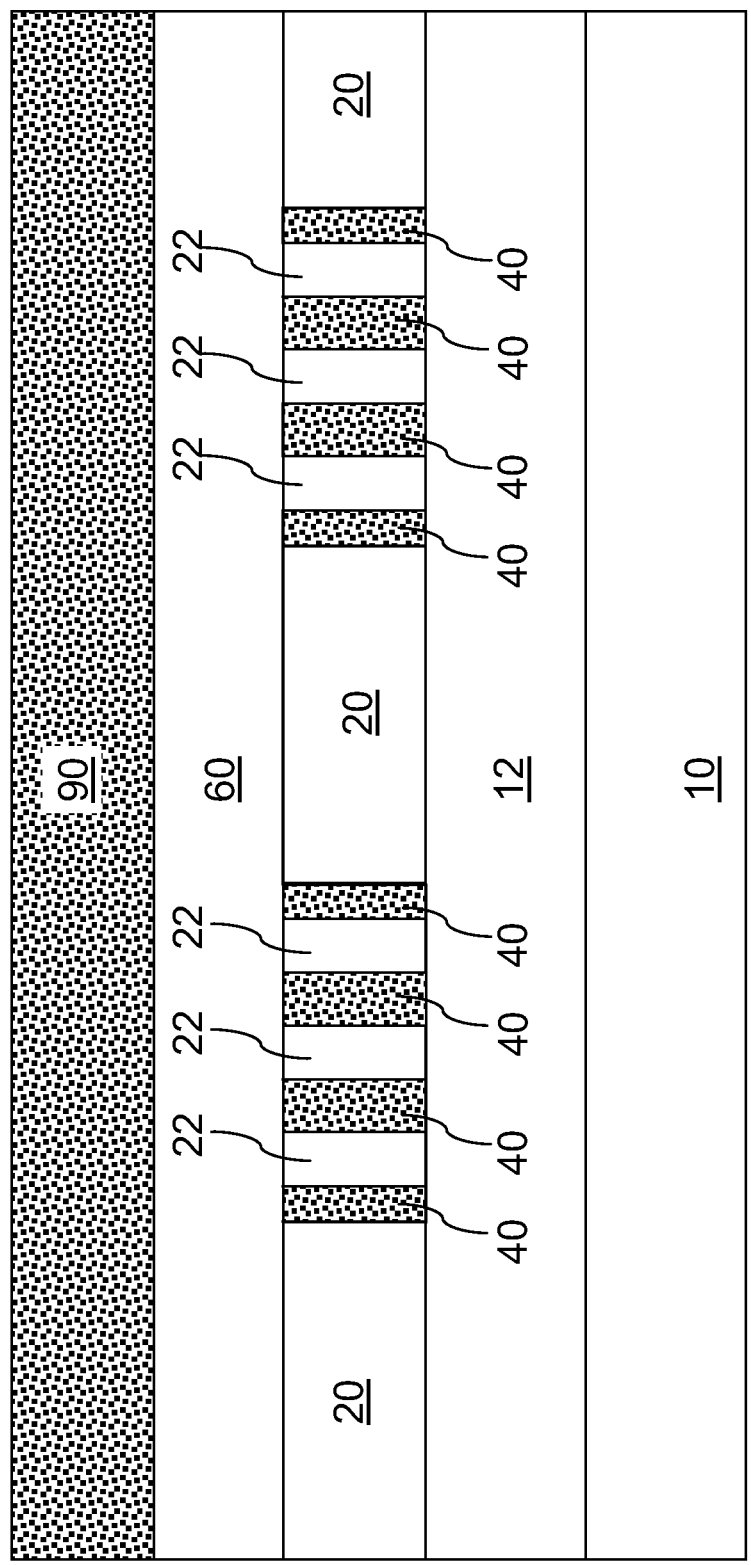
Figure 9C:
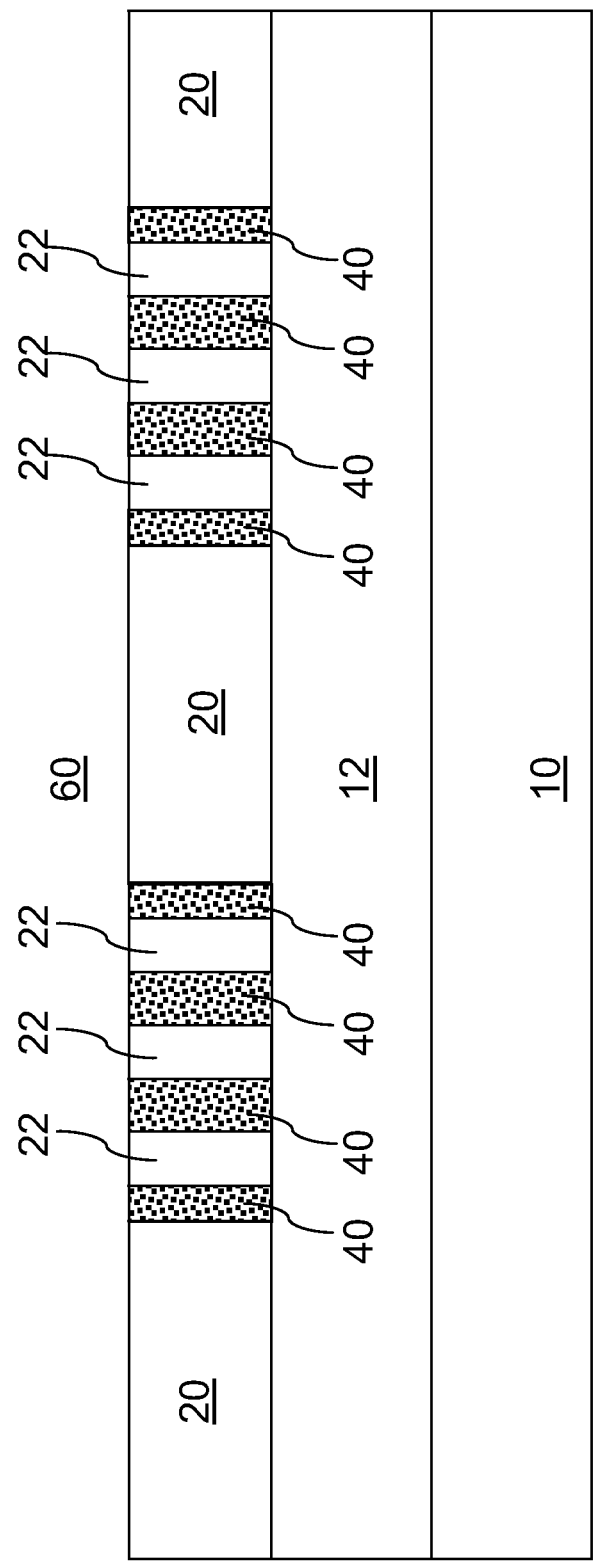

Referring to FIGS. 9A-9C, the second complementary lamellar structure 100 and the exposed portions of the second layer 60 are removed selective to the second primary lamellar structures 90 by an anisotropic etch such as a reactive ion etch. Top surfaces of the first layer 20, the filler portions 22, and the first primary lamellar structures 40 are exposed after the anisotropic etch. Thus, the second primary lamellar structures 90 are employed as an etch mask that contains a one dimensional array of lines having a sublithographic width and a sublithographic spacing. Variations of the present invention in which the second primary lamellar structure 90 and the exposed portions of the second layer 60 are removed selective to the second complementary lamellar structures 100 by an anisotropic etch such as a reactive ion etch are explicitly contemplated herein.

Figure 10A:
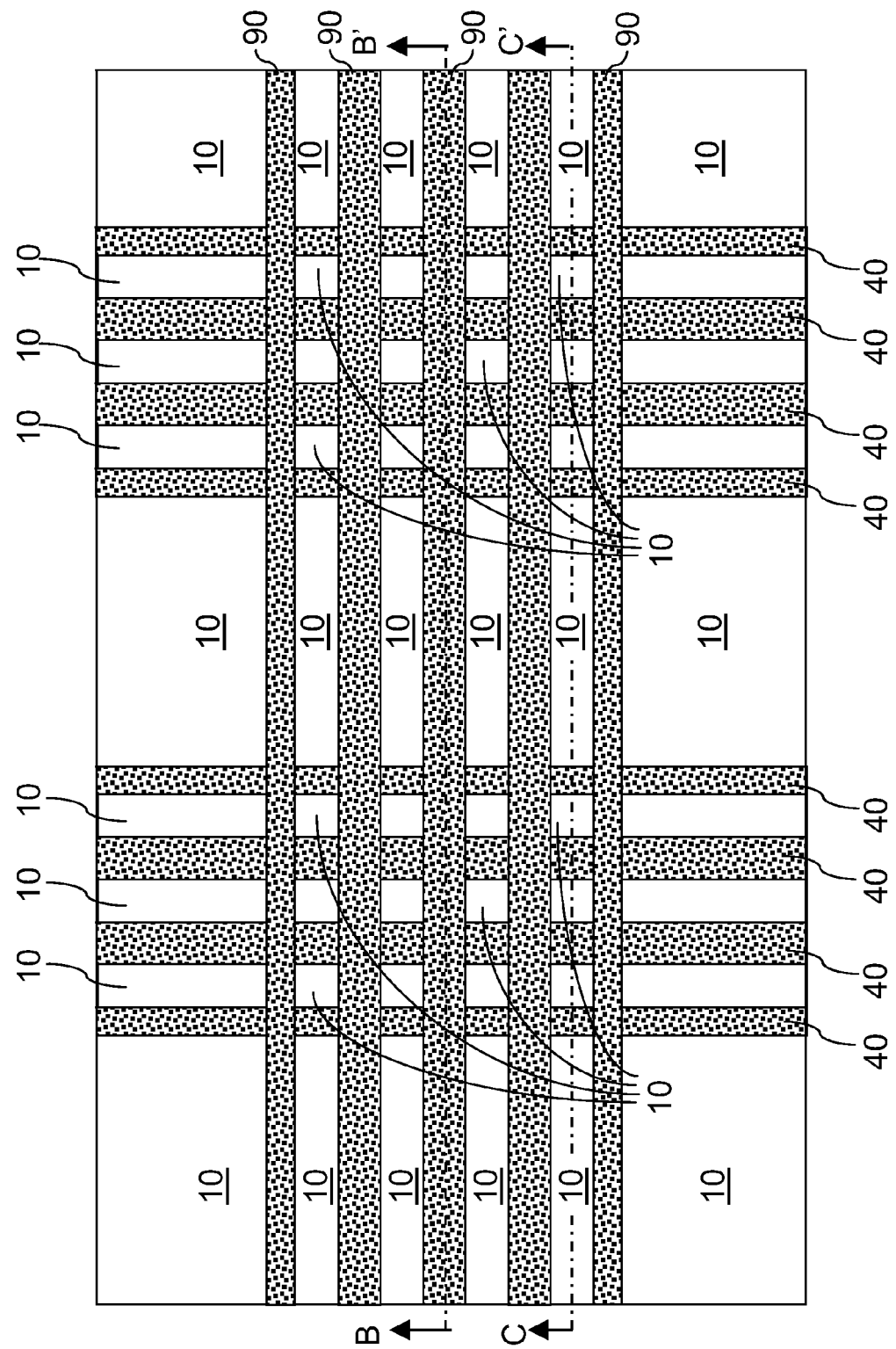

Referring to FIGS. 10A-10C, the filler portions 22, the first layer 20 and the underlayer 12 are etched by an anisotropic etch such as a reactive ion etch selective to the second primary lamellar structures 90 and the first primary lamellar structures 40. The underlayer 12, as patterned with the patterns of the second primary lamellar structures 90 and the first primary lamellar structures 40, is herein referred to as a pattern-containing layer 12'.

Figure 11A:
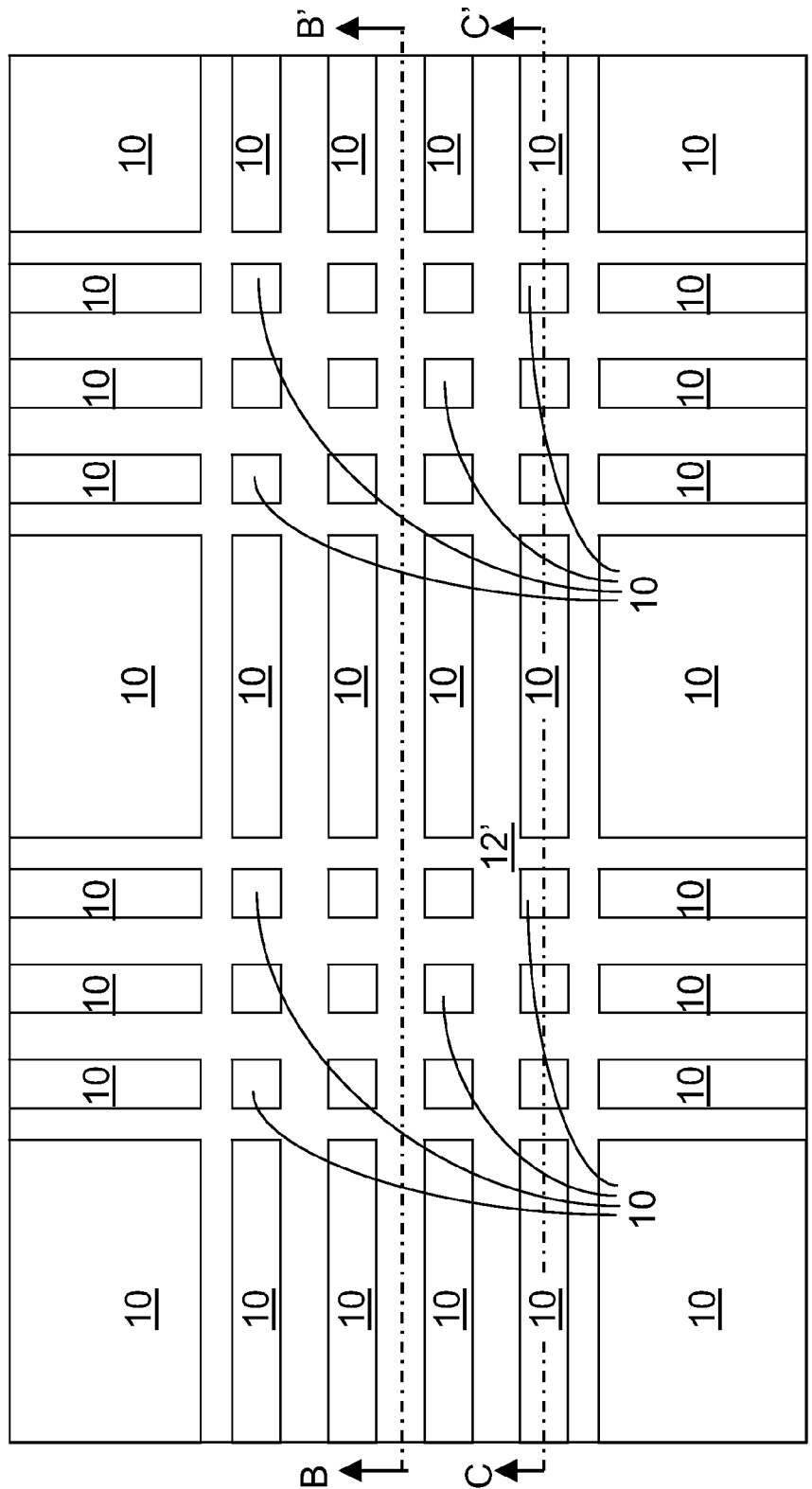

Referring to FIGS. 11A-11C, the second primary lamellar structures 90 and the first primary lamellar structures 40 as well as any remaining portions of the second layer 60, the filler portions 22, the first layer 20 that are located directly beneath the second primary lamellar structures 90 are removed selective to the pattern-containing layer 12' and the substrate 10.

The pattern-containing layer 12' contains a plurality of nanoscale trenches having nanoscale dimensions, which is typically sublithographic. The pattern of the trench is formed by juxtaposition of two patterns having a periodicity in two different directions. The first pattern comprises the pattern of the first primary lamellar structures 40 containing a first set of sublithographic width lines separated by a sublithographic spacing, which is the first lamellar spacing, and repeated in the direction perpendicular to the lengthwise edges of the first openings O1 (See FIG. 1B), which is herein referred to as a first direction. The second pattern comprises the pattern of the second primary lamellar structures 90 containing a second set of sublithographic width lines separated by another sublithographic spacing, which is the second lamellar spacing, and repeated in the direction perpendicular to the lengthwise edges of the second opening O2 (See FIG. 6C), which is herein referred to as a second direction.

The nanoscale trenches in the pattern-containing layer 12' is arranged in a two dimensional rectangular array or a two dimensional parallelogram-lattice array. The nanoscale trenches are repeated along the first direction and the second direction within the two dimensional array. Each of the nanoscale trenches has two pairs of sidewalls having a nanoscale dimension, i.e., a dimension from about 1 nm to about 40 nm, and typically from about 5 nm to about 30 nm.

Figure 12A:
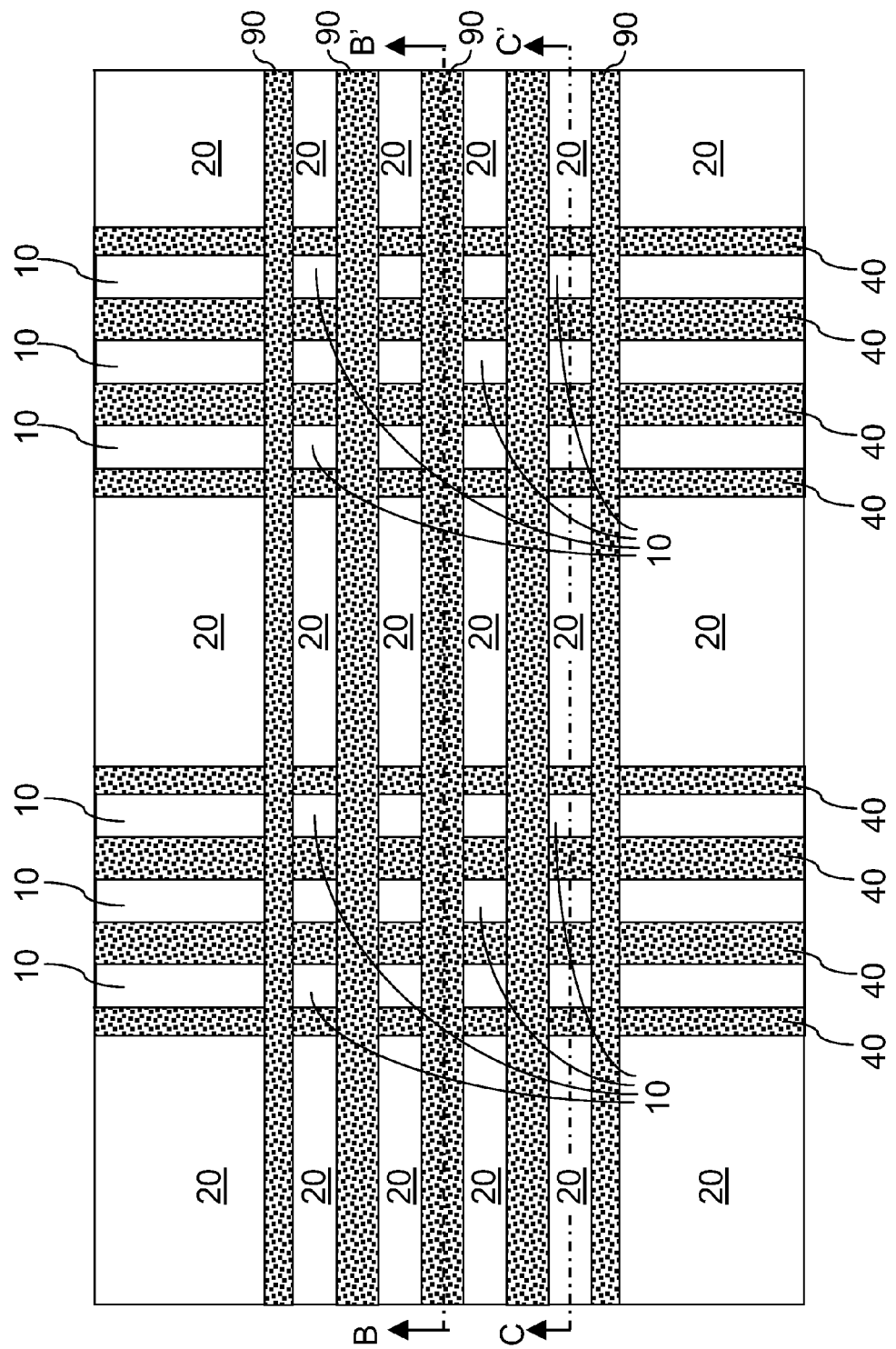
Figure 12B:
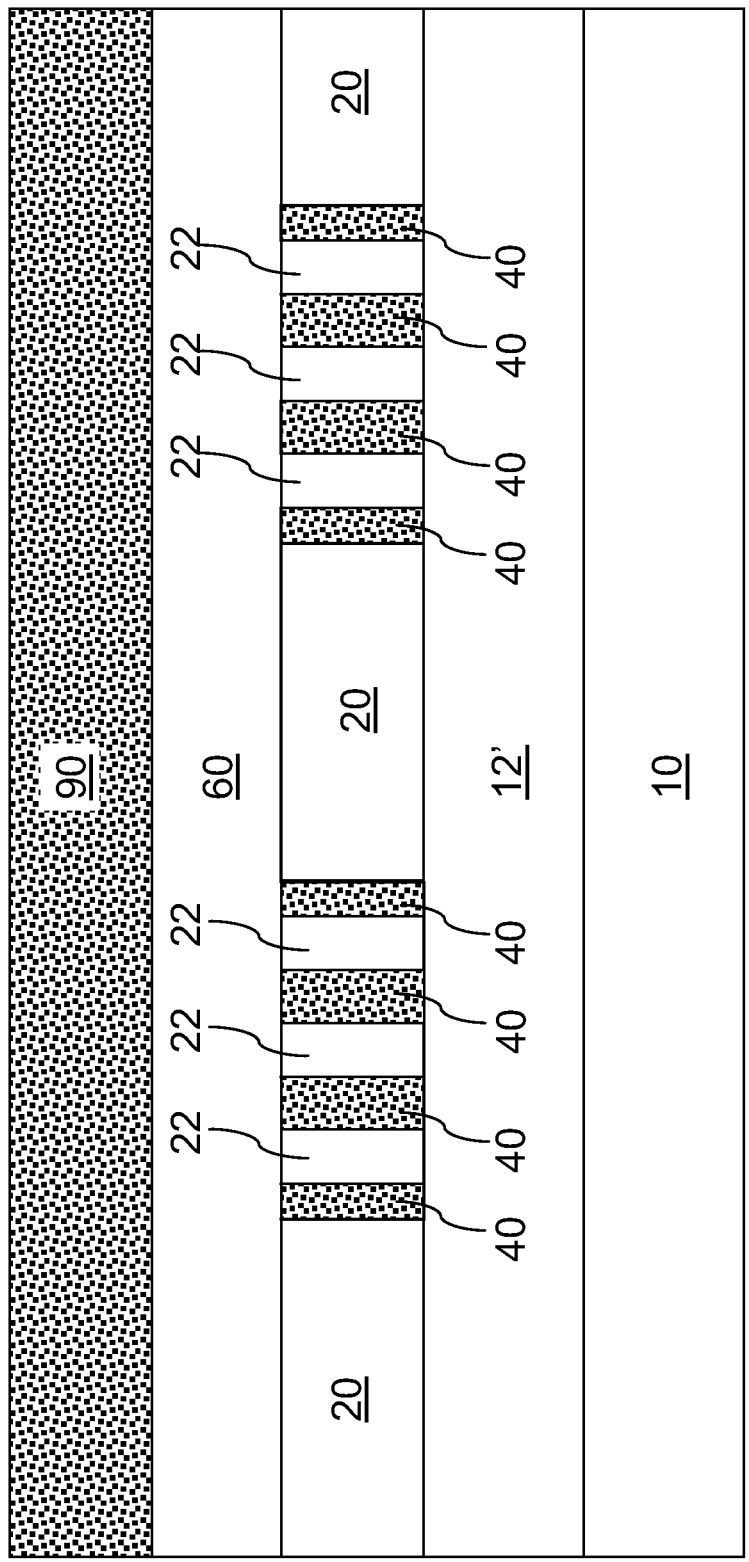
Figure 12C:
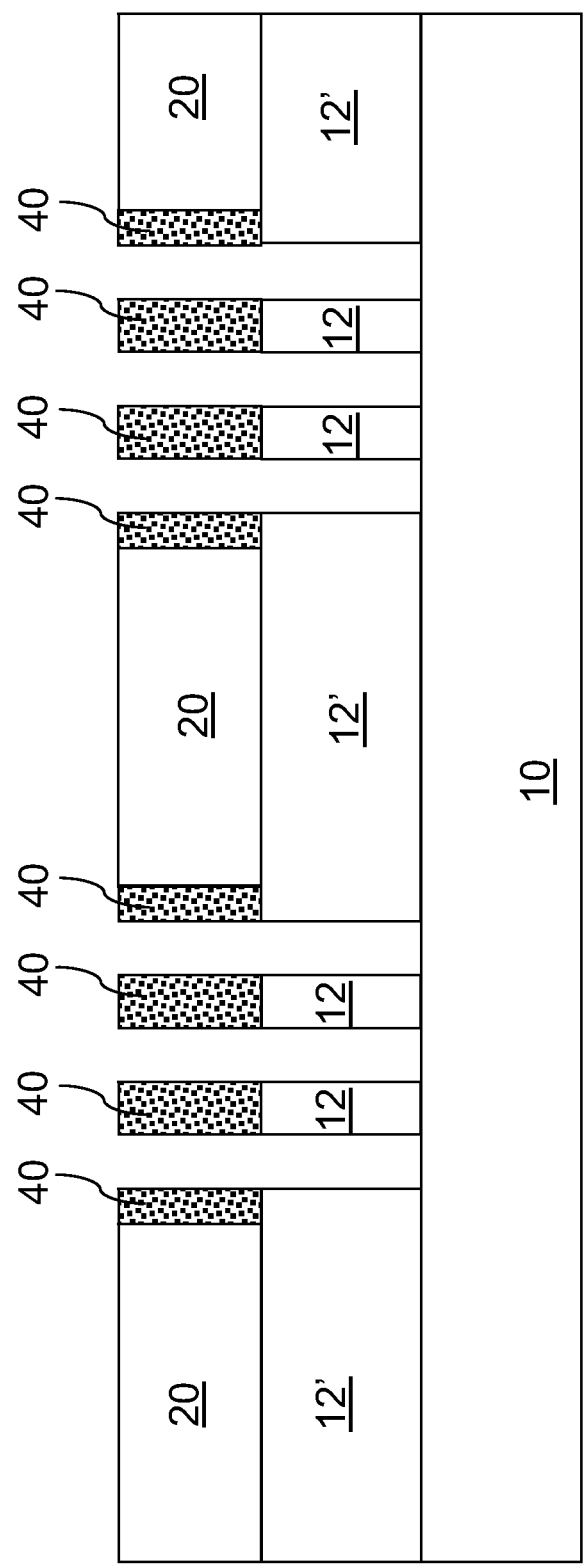

Referring to FIGS. 12A-12C, a second exemplary nanoscale structure according to a second embodiment of the present invention is derived from the first exemplary nanoscale structure of FIGS. 9A-9C by removing the filler portions 22 and the underlayer 12 by an anisotropic etch such as a reactive ion etch selective to the first layer 20, the second primary lamellar structures 90, and the first primary lamellar structures 40. The underlayer 12, as patterned with the patterns of the second primary lamellar structures 90 and the first primary lamellar structures 40, is herein referred to as a pattern-containing layer 12'.

According to the second embodiment, only the portion of the pattern of the second primary lamellar structures 90 within the area of the first openings (See FIG. 1B) are transferred into the pattern-containing layer 12' since the first layer 20 functions as an etch mask in combination with the second primary lamellar structures 90 and the first primary lamellar structures 40.

Figure 13A:
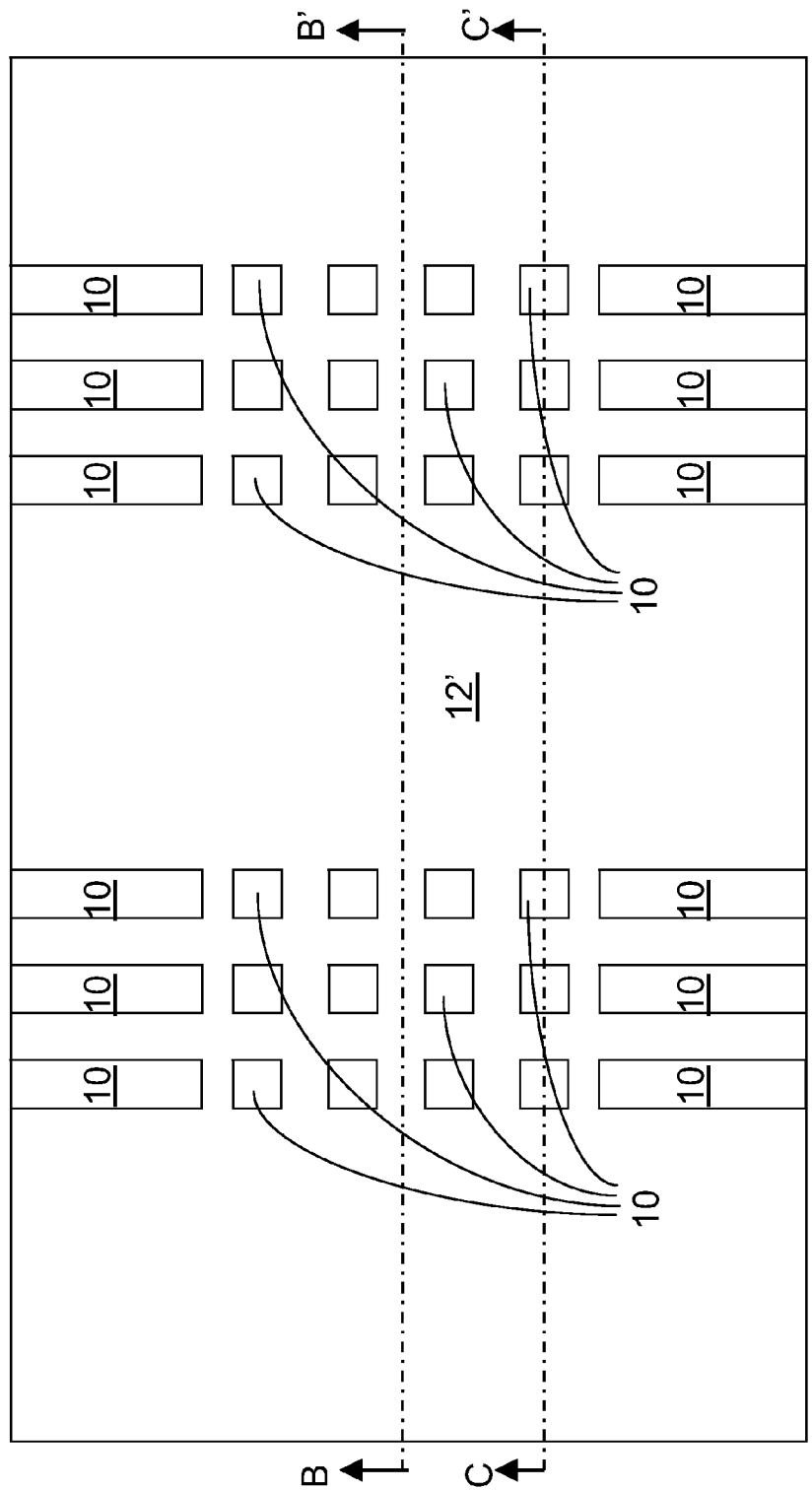

Referring to FIGS. 13A-13C, the first layer 20, the first primary lamellar structures 40, and the second primary lamellar structures 90 as well as any remaining portions of the second layer 60, the filler portions 22, the first layer 20 that are located directly beneath the second primary lamellar structures 90 are removed selective to the pattern-containing layer 12' and the substrate 10.

The pattern-containing layer 12' contains a plurality of nanoscale trenches having nanoscale dimensions, which is typically sublithographic. The pattern of the trench is formed by juxtaposition of two patterns having a periodicity in two different directions. The first pattern comprises the pattern of the first primary lamellar structures 40 containing a first set of sublithographic width lines separated by a sublithographic spacing, which is the first lamellar spacing, and repeated in the direction perpendicular to the lengthwise edges of the first openings O1 (See FIG. 1B), which is herein referred to as a first direction. The second pattern comprises the pattern of the second primary lamellar structures 90 containing a second set of sublithographic width lines separated by another sublithographic spacing, which is the second lamellar spacing, and repeated in the direction perpendicular to the lengthwise edges of the second opening O2 (See FIG. 6C), which is herein referred to as a second direction.

The nanoscale trenches in the pattern-containing layer 12' is arranged in a two dimensional rectangular array or a two dimensional parallelogram-lattice array. The nanoscale trenches are repeated along the first direction and the second direction within the two dimensional array. Each of the nanoscale trenches has two pairs of sidewalls having a nanoscale dimension, i.e., a dimension from about 1 nm to about 40 nm, and typically from about 5 nm to about 30 nm. The nanoscale trenches may have a rectangular horizontal cross-sectional area.

Figure 14A:
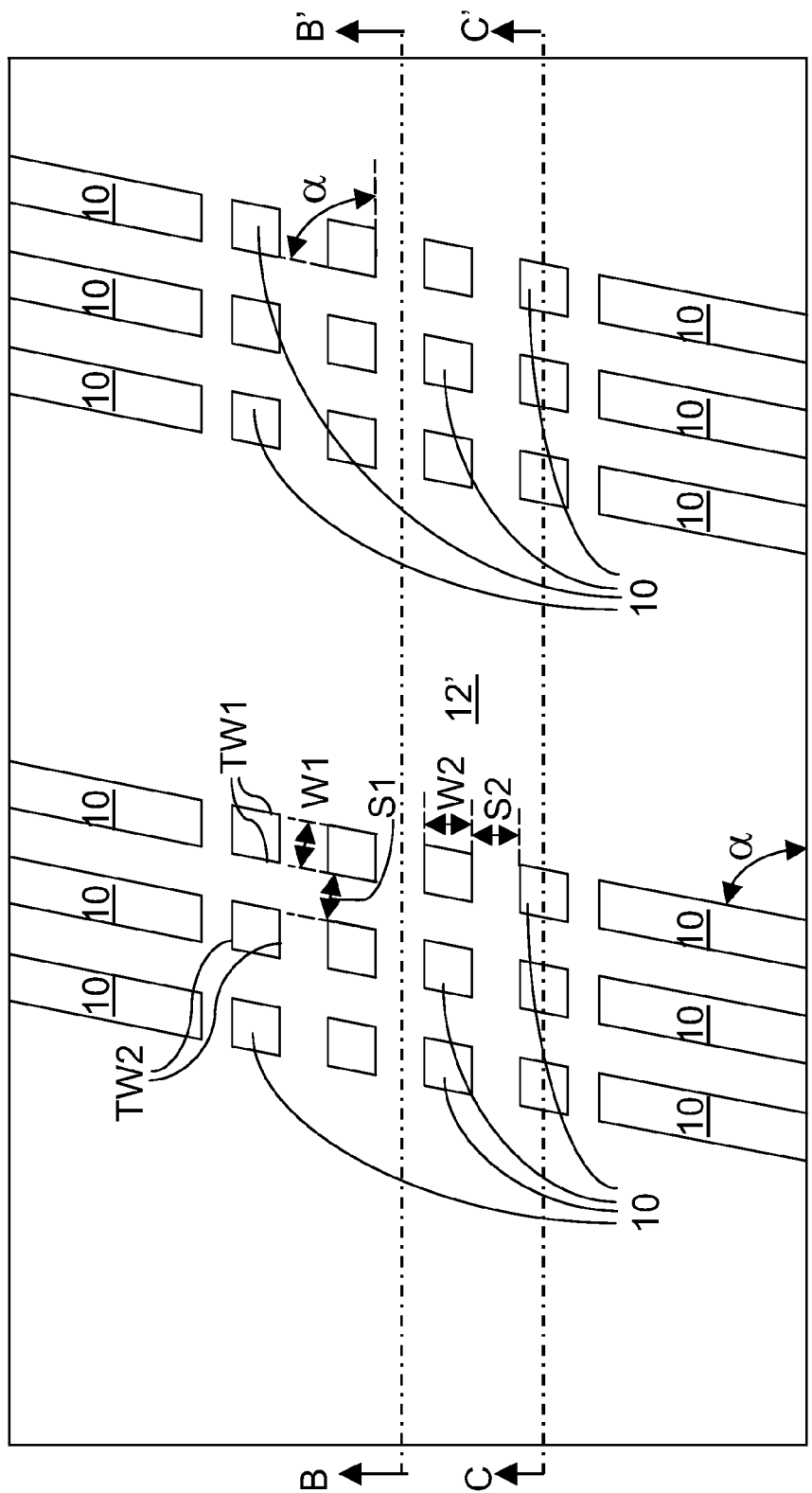
Figure 14B:
Figure 14C:
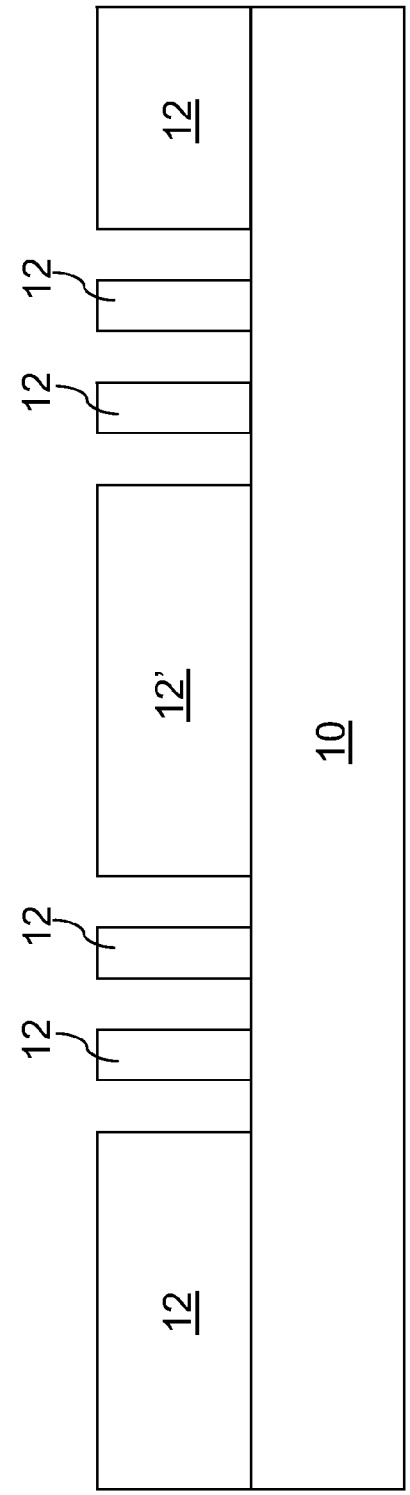

Referring to FIGS. 14A-14C, a generalized variation of the second exemplary nanoscale structure comprises a two dimensional parallelogram-lattice array of nanoscale trenches. Each of the nanoscale trenches has a set of first trench walls TW1 separated by a first width W1. A pair of first trench walls TW1 belonging to an adjacent pair of nanoscale trenches in the first direction, i.e., in the direction of the first nanoscale width W1, is separated by a first spacing S1. Each of the first width W1 and the first spacing S1 is a nanoscale dimension, e.g., from about 1 nm to about 40 nm, and typically from about 5 nm to about 30 nm Likewise, each of the nanoscale trenches has a set of second trench walls TW2 separated by a second width W2. A pair of second trench walls TW2 belonging to an adjacent pair of nanoscale trenches in the second direction, i.e., in the direction of the second nanoscale width W2, is separated by a second spacing S2. Each of the second width W2 and the second spacing S2 is a nanoscale dimension, e.g., from about 1 nm to about 40 nm, and typically from about 5 nm to about 30 nm.

The angle $\alpha$ between the first direction and the second direction may be any arbitrary angle other than zero. For example, the angle $\alpha$ may be between 0 degree and 60 degrees, 60 degrees, between 60 degrees and 90 degrees, or 90 degrees. The angle $\alpha$ between the first direction and the second direction is the same as an angle of a corner of a horizontal cross-sectional area of one of the nanoscale trenches, which is a parallelogram. Thus, the present invention enables an array of nanoscale trenches having sublithographic dimensions on the substrate 10.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising a two dimensional array of unit structures that constitute nanoscale uniform-width trenches located in a pattern-containing layer on a substrate, said pattern-containing layer comprising a same material throughout an entirety thereof, wherein each nanoscale uniform-width trench within said two dimensional array includes a trench bottom surface, a first pair of parallel sidewalls extending from said trench bottom surface to a topmost surface of, and directly adjoined to, said pattern-containing layer and consisting of sidewalls of said same material, and a second pair of parallel sidewalls extending from said trench bottom surface to said topmost surface of, and directly adjoined to, said pattern-containing layer and consisting of additional sidewalls of said same material, wherein said unit structures are repeated along a first direction that is perpendicular to said first pairs of parallel sidewalls and along a second direction that is perpendicular to said second pairs of parallel sidewalls and is different from said first direction within said two dimensional array, and wherein, within said two dimensional array, each first pair of parallel sidewalls is separated by a first sublithographic distance that is invariant under lateral translation along a direction perpendicular to said first direction and each second pair of parallel sidewalls is separated by a second sublithographic distance that is invariant under lateral translation along a direction perpendicular to said second direction, wherein said first sublithographic distance is less than 45 nm, and said second sublithographic distance is less than 45 nm.

2. The structure of claim 1, wherein an angle between said first direction and said second direction is the same as an angle between one of said first pair of parallel sidewalls and one of said second pair of parallel sidewalls.

3. The structure of claim 1, wherein a horizontal cross-sectional area of one of said nanoscale uniform-width trenches is a parallelogram.

4. The structure of claim 1, further comprising a set of additional uniform-width trenches having a same periodicity along said first direction as said two dimensional array of nanoscale uniform-width trenches and laterally extending longer than a periodicity of said two dimensional array along said second direction.

5. The structure of claim 1, further comprising:
a first set of first additional uniform-width trenches having a same periodicity along said first direction as said two dimensional array of nanoscale uniform-width trenches and laterally extending longer than a periodicity of said two dimensional array along said second direction; and
a second set of second additional uniform-width trenches having a same periodicity along said second direction as said two dimensional array of nanoscale uniform-width trenches and laterally extending longer than a periodicity of said two dimensional array along said first direction.

6. The structure of claim 1, wherein a first spacing between an adjacent pair of said nanoscale uniform-width trenches in said first direction is sublithographic, and a second spacing between an adjacent pair of said nanoscale uniform-width trenches in said second direction is sublithographic.

7. The structure of claim 1, wherein all bottom surfaces of said two dimensional array of nanoscale uniform-width trenches are located within a horizontal plane.

8. A structure comprising a two dimensional array of unit structures that constitute nanoscale uniform-width trenches located in a pattern-containing layer on a substrate, said pattern-containing layer comprising a same material throughout an entirety thereof, wherein each nanoscale uniform-width trench within said two dimensional array includes a trench bottom surface, a first pair of parallel sidewalls extending from said trench bottom surface to a topmost surface of, and directly adjoined to, said pattern-containing layer and consisting of sidewalls of said same material, and a second pair of parallel sidewalls extending from said trench bottom surface to said topmost surface of, and directly adjoined to, said pattern-containing layer and consisting of additional sidewalls of said same material, wherein said unit structures are repeated along a first direction that is perpendicular to said first pairs of parallel sidewalls and along a second direction that is perpendicular to said second pairs of parallel sidewalls and is different from said first direction within said two dimensional array, and wherein, within said two dimensional array, each first pair of parallel sidewalls is separated by a first sublithographic distance that is invariant under lateral translation along a direction perpendicular to said first direction and each second pair of parallel sidewalls is separated by a second sublithographic distance that is invariant under lateral translation along a direction perpendicular to said second direction, wherein said pattern containing layer comprises a material selected from a semiconductor material, a metal, a dielectric nitride, or a porous or non-porous low-dielectric constant dielectric material having a dielectric constant less than a dielectric constant of silicon oxide.

9. The structure of claim 8, wherein all sidewall surfaces and bottom surfaces of said a two dimensional array of nanoscale uniform-width trenches are surfaces of said material selected from a semiconductor material, a metal, a dielectric nitride, or a porous or non-porous low-dielectric constant dielectric material having a dielectric constant less than a dielectric constant of silicon oxide.

10. The structure of claim 8, wherein an angle between said first direction and said second direction is the same as an angle between one of said first pair of parallel sidewalls and one of said second pair of parallel sidewalls.

11. The structure of claim 8, wherein a horizontal cross-sectional area of one of said nanoscale uniform-width trenches is a parallelogram.

12. The structure of claim 8, further comprising a set of additional uniform-width trenches having a same periodicity along said first direction as said two dimensional array of nanoscale uniform-width trenches and laterally extending longer than a periodicity of said two dimensional array along said second direction.

13. The structure of claim 8, further comprising:
a first set of first additional uniform-width trenches having a same periodicity along said first direction as said two dimensional array of nanoscale uniform-width trenches and laterally extending longer than a periodicity of said two dimensional array along said second direction; and
a second set of second additional uniform-width trenches having a same periodicity along said second direction as said two dimensional array of nanoscale uniform-width trenches and laterally extending longer than a periodicity of said two dimensional array along said first direction.

14. The structure of claim 8, wherein said first distance and said second distance are sublithographic distances, and a first spacing between an adjacent pair of said nanoscale uniform-width trenches in said first direction is sublithographic, and a second spacing between an adjacent pair of said nanoscale uniform-width trenches in said second direction is sublithographic.

15. A structure comprising a two dimensional array of unit structures that constitute nanoscale uniform-width trenches located in a pattern-containing layer on a substrate, said pattern-containing layer comprising a same material throughout an entirety thereof, wherein each nanoscale uniform-width trench within said two dimensional array includes a trench bottom surface, a first pair of parallel sidewalls extending from said trench bottom surface to a topmost surface of, and directly adjoined to, said pattern-containing layer and consisting of sidewalls of said same material, and a second pair of parallel sidewalls extending from said trench bottom surface to said topmost surface of, and directly adjoined to, said pattern-containing layer and consisting of additional sidewalls of said same material, wherein said unit structures are repeated along a first direction that is perpendicular to said first pairs of parallel sidewalls and along a second direction that is perpendicular to said second pairs of parallel sidewalls and is different from said first direction within said two dimensional array, and wherein, within said two dimensional array, each first pair of parallel sidewalls is separated by a first sublithographic distance that is invariant under lateral translation along a direction perpendicular to said first direction and each second pair of parallel sidewalls is separated by a second sublithographic distance that is invariant under lateral translation along a direction perpendicular to said second direction, wherein sidewalls of each nanoscale uniform-width trench has a pair of first edges extending along said first direction and a pair of second edges extending along said second direction, and said first edges and said second edges are located within a same plane including a topmost surface of said pattern-containing layer and collectively constitute a parallelogram including adjoined edges.

16. The structure of claim 15, wherein all sidewall surfaces and bottom surfaces of said a two dimensional array of nanoscale uniform-width trenches are surfaces of a material selected from a semiconductor material, a metal, a dielectric nitride, or a porous or non-porous low-dielectric constant dielectric material having a dielectric constant less than a dielectric constant of silicon oxide.

17. The structure of claim 15, wherein an angle between said first direction and said second direction is the same as an angle between one of said first pair of parallel sidewalls and one of said second pair of parallel sidewalls.

18. The structure of claim 15, wherein a horizontal cross-sectional area of one of said nanoscale uniform-width trenches is a parallelogram.

19. The structure of claim 15, further comprising a set of additional uniform-width trenches having a same periodicity along said first direction as said two dimensional array of nanoscale uniform-width trenches and laterally extending longer than a periodicity of said two dimensional array along said second direction.

20. The structure of claim 15, wherein said first distance and said second distance are sublithographic distances, and a first spacing between an adjacent pair of said nanoscale uniform-width trenches in said first direction is sublithographic, and a second spacing between an adjacent pair of said nanoscale uniform-width trenches in said second direction is sublithographic.

* * * * *